US012727337B2

(12) United States Patent
Jung

(10) Patent No.: US 12,727,337 B2
(45) Date of Patent: Sep. 1, 2026

(54) DISPLAY APPARATUS AND METHOD OF MANUFACTURING THE SAME

(71) Applicant: Samsung Display Co., LTD., Yongin-si (KR)

(72) Inventor: Inyoung Jung, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 303 days.

(21) Appl. No.: 18/496,758

(22) Filed: Oct. 27, 2023

(65) Prior Publication Data

US 2024/0147778 A1 May 2, 2024

(30) Foreign Application Priority Data

Oct. 31, 2022 (KR) ........................ 10-2022-0142464

(51) Int. Cl.

*H10K 59/122* (2023.01)
*H10H 29/30* (2025.01)
*H10K 59/12* (2023.01)

(52) U.S. Cl.

CPC ........... *H10K 59/122* (2023.02); *H10H 29/30* (2025.01); *H10K 59/12* (2023.02); *H10K 59/1201* (2023.02)

(58) Field of Classification Search

CPC .. H10K 59/122; H10K 59/12; H10K 59/1201; H10K 59/1315; H10K 59/131; H10K 59/1213; H10K 59/123; H10K 59/8051; H10K 59/80521; H10K 59/873; H10K 50/11; H10K 59/88; H10K 571/00; H10H 29/30

See application file for complete search history.

(56) References Cited

U.S. PATENT DOCUMENTS 8,941,142 B2 1/2015 Chung
9,287,531 B2 3/2016 Lee
11,121,198 B2 9/2021 Baek et al.
(Continued)

FOREIGN PATENT DOCUMENTS

CN 103824964 A 5/2014
CN 113471384 A 10/2021
(Continued)

*Primary Examiner* — Galina G Yushina

(74) *Attorney, Agent, or Firm* — Womble Bond Dickinson (US) LLP

(57) ABSTRACT

A display apparatus includes: a first sub-pixel electrode; a common voltage electrode adjacent to the first sub-pixel electrode; a metal bank layer having a first opening and a first contact hole and including a first metal layer and a second metal layer, wherein the first opening overlaps the first sub-pixel electrode, and the first contact hole overlaps the common voltage electrode; an insulating layer between an outer portion of the first sub-pixel electrode and the metal bank layer; a first intermediate layer overlapping the first sub-pixel electrode at the first opening; a first opposite electrode on the first intermediate layer at the first opening and electrically connected to the metal bank layer; and a connection electrode electrically connected to the common voltage electrode through the first contact hole of the metal bank layer, wherein the connection electrode electrically connects the metal bank layer to the common voltage electrode.

20 Claims, 31 Drawing Sheets

(56) References Cited

U.S. PATENT DOCUMENTS

2005/0179374 A1* 8/2005 Kwak .............. H10K 59/80522 313/506
2009/0278450 A1* 11/2009 Sonoyama ........... H10K 59/876 313/504
2012/0228603 A1* 9/2012 Nakamura ........... H10K 50/824 257/40
2017/0309693 A1* 10/2017 Pang .................... H10K 59/122
2018/0006264 A1 1/2018 Lee et al.
2019/0326370 A1* 10/2019 Lu ...................... H10D 30/6723
2020/0105845 A1* 4/2020 Yang .................... H10K 59/122
2020/0243625 A1* 7/2020 Beak .................. H10K 59/1213
2021/0217824 A1* 7/2021 Lin ........................ H10K 59/35
2022/0077251 A1 3/2022 Choung et al.
2022/0077252 A1 3/2022 Choung et al.
2022/0157899 A1 5/2022 Yanagisawa et al.
2023/0085752 A1* 3/2023 Yao .................... H10H 20/8514 257/79
2023/0200152 A1* 6/2023 Choi .................... H10K 59/126 257/72

FOREIGN PATENT DOCUMENTS

JP 2022-080004 A 5/2022
KR 10-2018-0003965 A 1/2018
KR 10-1980780 B1 5/2019
KR 10-2260860 B1 6/2021

* cited by examiner

FIG. 7F

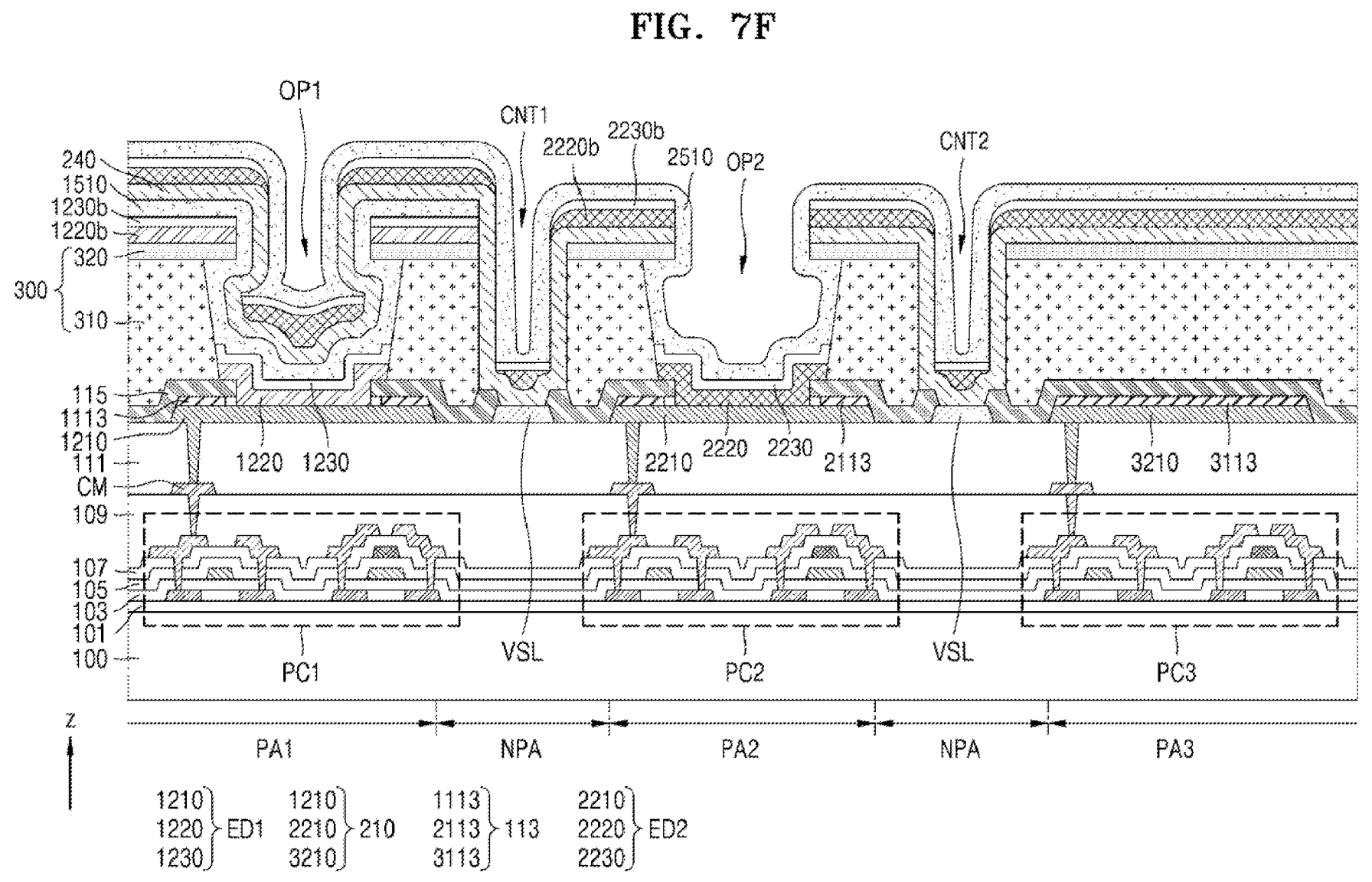

OP1 CNT1 2220b 2230b 2510 OP2 CNT2

240 1510 1230b 1220b 320 310 300 115 1113 1210 111 CM 109 107 105 103 101 100 Z 1220 1230 2210 2220 2230 2113 3210 3113

VSL VSL

PC1 PC2 PC3

PA1 NPA PA2 NPA PA3

1210 1220 1230 ED1 1210 2210 3210 210 1113 2113 3113 113 2210 2220 2230 ED2

OP1
CNT1
2220b
2230b
2510
OP2
PR
CNT2
2230
2220
2210
2113
3210
3113
VSL
PC1
PC2
PC3
PA1
NPA
PA2
PA3
240
1510
1230b
1220b
320
300
310
1230
1220
115
1113
1210
111
CM
109
107
105
103
101
100
Z
1210
1220
1230
ED1
2210
3210
210
1113
2113
3113
113
2220
2230
ED2

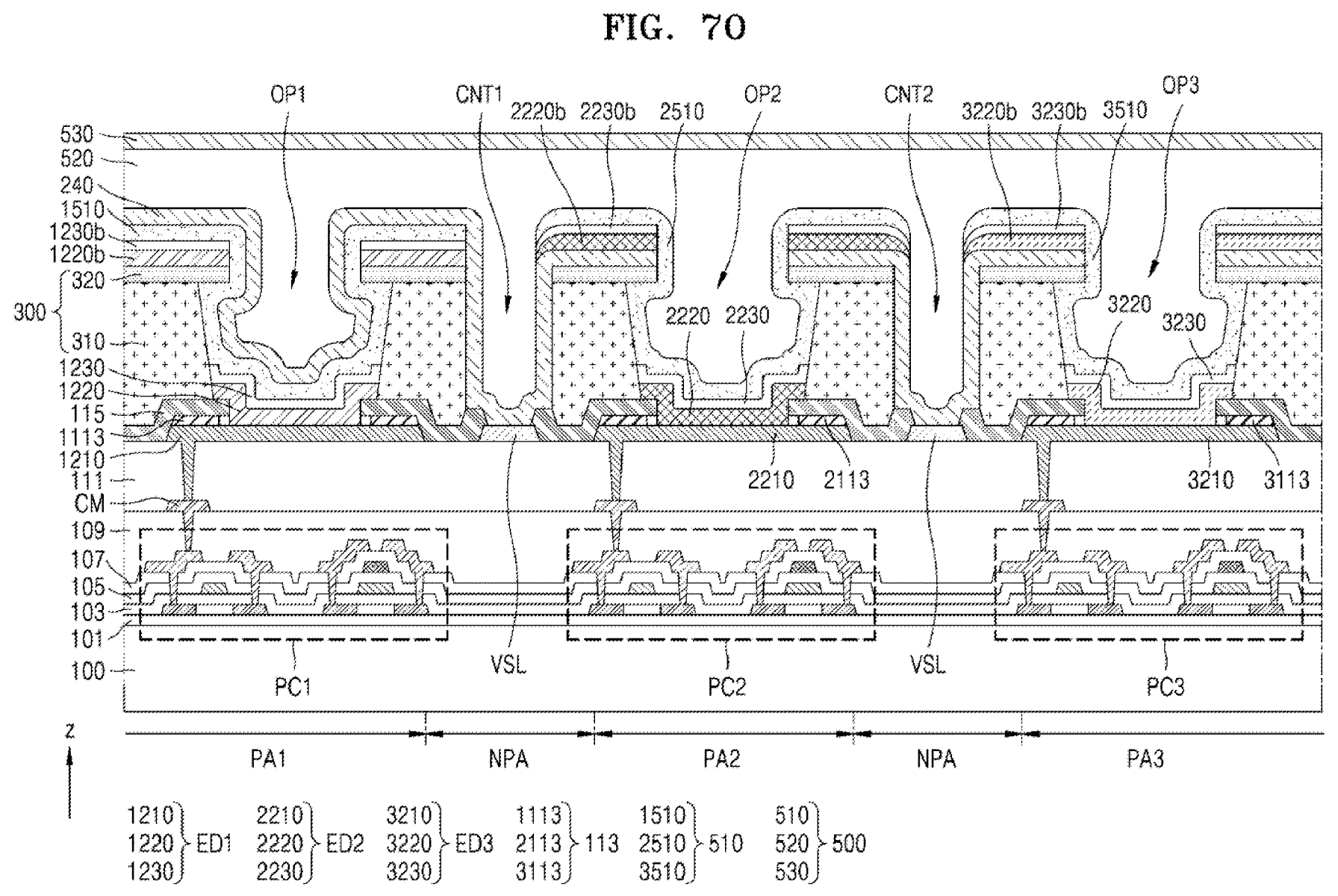

DISPLAY APPARATUS AND METHOD OF MANUFACTURING THE SAME

CROSS-REFERENCE TO RELATED APPLICATION

The present application claims priority to and the benefit of Korean Patent Application No. 10-2022-0142464, filed on Oct. 31, 2022, in the Korean Intellectual Property Office, the entire disclosure of which is incorporated herein by reference.

BACKGROUND

1. Field

Aspects of one or more embodiments relate to a display apparatus and a method of manufacturing the display apparatus.

2. Description of the Related Art

A display apparatus visually displays data. The display apparatus may include a substrate divided into a display area and a peripheral (or non-display) area. A scan line is insulated from a data line in the display area, and a plurality of pixels may be arranged in the display area. A thin-film transistor and a sub-pixel electrode electrically connected to the thin-film transistor may be provided in the display area, wherein each of the thin-film transistor and the sub-pixel electrode corresponds to each of the pixels.

In addition, an opposite electrode may be provided in the display area, wherein the opposite electrode is commonly provided to the pixels. Various wirings, a scan driver, a data driver, a controller, a pad portion, and the like configured to transfer electrical signals to the display area may be provided in the peripheral area.

The uses and applications of display apparatuses has diversified over time. Accordingly, there have been various attempts for a design to improve quality of a display apparatus.

The above information disclosed in this Background section is only for enhancement of understanding of the background and therefore the information discussed in this Background section does not necessarily constitute prior art.

SUMMARY

Aspects of one or more embodiments include a display apparatus configured to display relatively high quality images. However, such characteristics are merely examples according to some embodiments, and embodiments according to the present disclosure are not limited thereto.

Additional aspects will be set forth in part in the description which follows and, in part, will be apparent from the description, or may be learned by practice of the presented embodiments of the disclosure.

According to one or more embodiments, a display apparatus includes a first sub-pixel electrode, a common voltage electrode arranged to be adjacent to the first sub-pixel electrode, a metal bank layer having a first opening and a first contact hole and including a first metal layer and a second metal layer on the first metal layer, wherein the first opening overlaps the first sub-pixel electrode, and the first contact hole overlaps the common voltage electrode, an insulating layer arranged between an outer portion of the first sub-pixel electrode and the metal bank layer, a first intermediate layer overlapping the first sub-pixel electrode through the first opening of the metal bank layer, a first opposite electrode on the first intermediate layer through the first opening of the metal bank layer and electrically connected to the metal bank layer, and a connection electrode electrically connected to the common voltage electrode through the first contact hole of the metal bank layer, wherein the connection electrode electrically connects the metal bank layer to the common voltage electrode.

According to some embodiments, the first opposite electrode may directly contact a lateral surface of the first metal layer facing the first opening of the metal bank layer.

According to some embodiments, the connection electrode may directly contact a lateral surface of the metal bank layer facing the first contact hole of the metal bank layer.

According to some embodiments, the display apparatus may further include a first inorganic encapsulation layer on the first opposite electrode, wherein the connection electrode may extend on the first inorganic encapsulation layer.

According to some embodiments, the display apparatus may further include a first organic encapsulation layer on the connection electrode, and a second inorganic encapsulation layer on the first organic encapsulation layer.

According to some embodiments, a portion of the second metal layer facing the first opening of the metal bank layer may include a tip extending to the first opening from a point at which a bottom surface of the second metal layer contacts a lateral surface of the first metal layer.

According to some embodiments, the connection electrode may include a same material as a material of the first opposite electrode.

According to some embodiments, the display apparatus may further include a protective layer arranged between the outer portion of the first sub-pixel electrode and the insulating layer.

According to some embodiments, the protective layer may include a transparent conductive oxide (TCO).

According to some embodiments, the display apparatus may further include a first dummy intermediate layer including a same material as a material of the first intermediate layer and on the second metal layer.

According to some embodiments, the display apparatus may further include a first dummy opposite electrode including a same material as a material of the first opposite electrode and on the first dummy intermediate layer.

According to some embodiments, the display apparatus may further include a second sub-pixel electrode, a second intermediate layer overlapping the second sub-pixel electrode through a second opening of the metal bank layer, and a second opposite electrode on the second intermediate layer through the second opening of the metal bank layer, wherein the common voltage electrode may be arranged between the first sub-pixel electrode and the second sub-pixel electrode.

According to some embodiments, the display apparatus may further include a second dummy intermediate layer including a same material as a material of the second intermediate layer and on the second metal layer, and a second dummy opposite electrode including a same material as a material of the second opposite electrode and on the second dummy intermediate layer, wherein the connection electrode may be arranged between the second dummy intermediate layer and the second metal layer.

According to one or more embodiments, a method of manufacturing a display apparatus includes forming a sub-pixel electrode including a first sub-pixel electrode, a second sub-pixel electrode, and a third sub-pixel electrode, forming a common voltage electrode adjacent to at least one of the first sub-pixel electrode, the second sub-pixel electrode, or the third sub-pixel electrode, forming an insulating layer on the first sub-pixel electrode, the second sub-pixel electrode, the third sub-pixel electrode, and the common voltage electrode, forming a metal bank layer on the insulating layer, the metal bank layer including a first metal layer and a second metal layer on the first metal layer, forming a first opening of the metal bank layer overlapping the first sub-pixel electrode, forming an opening of the insulating layer overlapping the first sub-pixel electrode, forming a first intermediate layer overlapping the first sub-pixel electrode through the first opening of the metal bank layer and the opening of the insulating layer, forming a first opposite electrode on the first intermediate layer through the first opening of the metal bank layer and the opening of the insulating layer, forming a first contact hole in the insulating layer and the metal bank layer to overlap the common voltage electrode, and forming a connection electrode electrically connected to the common voltage electrode through the first contact hole and electrically connecting the metal bank layer to the common voltage electrode.

According to some embodiments, the forming of the first opposite electrode may include depositing the first opposite electrode such that the first opposite electrode directly contacts a lateral surface of the first metal layer facing the first opening of the metal bank layer, and the forming of the connection electrode may include depositing the connection electrode such that the connection electrode directly contacts a lateral surface of the first metal layer facing the first contact hole of the metal bank layer.

According to some embodiments, the forming of the first contact hole may include forming photoresists to respectively overlap the first sub-pixel electrode, the second sub-pixel electrode, and the third sub-pixel electrode.

According to some embodiments, the forming of the photoresist may include forming a first photoresist to overlap the first sub-pixel electrode using a full-tone mask, forming a second photoresist to overlap the second sub-pixel electrode using a half-tone mask, and forming a third photoresist to overlap the third sub-pixel electrode using a half-tone mask.

According to some embodiments, the forming of the first contact hole may include removing a portion of the insulating layer, the metal bank layer, the first intermediate layer, and the first opposite electrode overlapping the common voltage electrode, and removing a portion of the first intermediate layer and the first opposite electrode overlapping the second photoresist and the third photoresist.

According to some embodiments, the method may further include forming a first inorganic encapsulation layer on the first opposite electrode, wherein the connection electrode may be formed on the first inorganic encapsulation layer.

According to some embodiments, the forming of the first opening of the metal bank layer may include etching the first metal layer such that a portion of the second metal layer facing the first opening of the metal bank layer includes a tip extending to the first opening from a point at which a bottom surface of the second metal layer contacts a lateral surface of the first metal layer.

BRIEF DESCRIPTION OF THE DRAWINGS

The above and other aspects, features, and characteristics of certain embodiments of the disclosure will be more apparent from the following description taken in conjunction with the accompanying drawings, in which.

DETAILED DESCRIPTION

Figure 1:
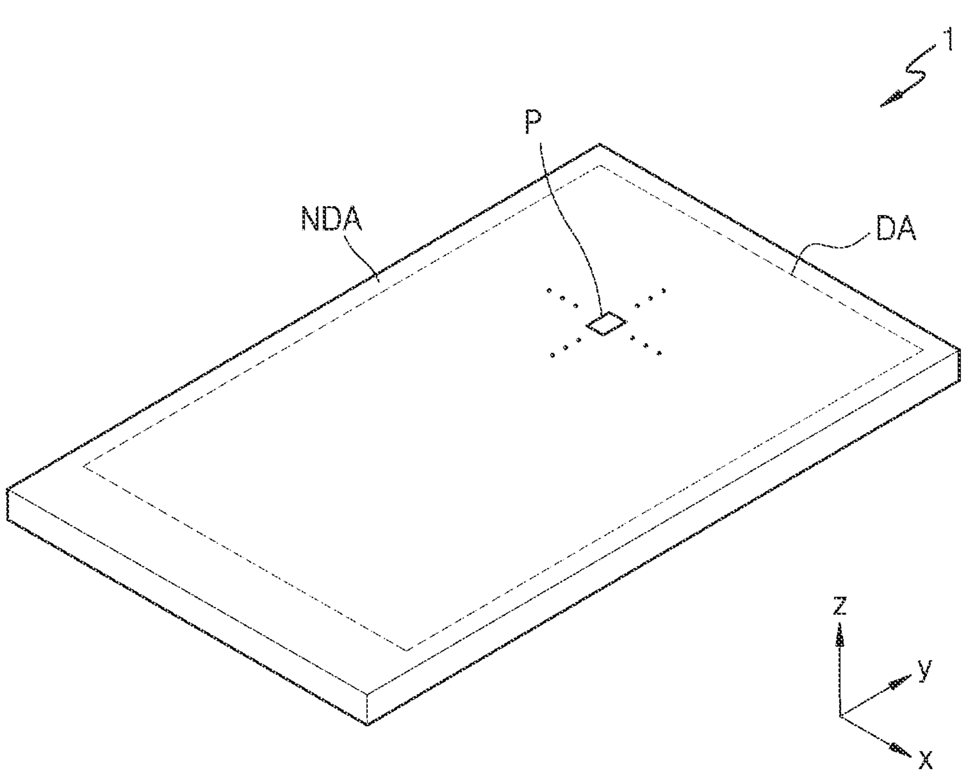
FIG. 1 is a schematic perspective view of a display apparatus according to some embodiments.

Reference will now be made in more detail to aspects of some embodiments, which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the present disclosure allows for various changes and numerous embodiments, certain embodiments will be illustrated in the drawings and described in the written description. Effects and features of the disclosure, and methods for achieving them will be clarified with reference to embodiments described below in detail with reference to the drawings. However, the disclosure is not limited to the following embodiments and may be embodied in various forms.

Hereinafter, embodiments will be described with reference to the accompanying drawings, wherein like reference numerals refer to like elements throughout and a repeated description thereof is omitted.

While such terms as "first" and "second" may be used to describe various components, such components must not be limited to the above terms. The above terms are used to distinguish one component from another.

The singular forms "a," "an," and "the" as used herein are intended to include the plural forms as well unless the context clearly indicates otherwise.

It will be understood that the terms "comprise," "comprising," "include" and/or "including" as used herein specify the presence of stated features or components but do not preclude the addition of one or more other features or components.

It will be further understood that, when a layer, region, or component is referred to as being "on" another layer, region, or component, it can be directly or indirectly on the other layer, region, or component. That is, for example, intervening layers, regions, or components may be present.

Sizes of elements in the drawings may be exaggerated or reduced for convenience of explanation. As an example, the size and thickness of each element shown in the drawings are arbitrarily represented for convenience of description, and thus, the present disclosure is not necessarily limited thereto.

In the case where a certain embodiment may be implemented differently, a specific process order may be performed in an order different from the described order. As an example, two processes successively described may be simultaneously (or concurrently) performed substantially and performed in the opposite order.

In the present specification, "A and/or B" means A or B, or A and B. In the present specification, "at least one of A and B" means A or B, or A and B.

It will be understood that when a layer, region, or element is referred to as being "connected" to another layer, region, or element, it may be "directly connected" to the other layer, region, or element or may be "indirectly connected" to the other layer, region, or element with another layer, region, or element interposed therebetween. For example, it will be understood that when a layer, region, or element is referred to as being "electrically connected" to another layer, region, or element, it may be "directly electrically connected" to the other layer, region, or element or may be "indirectly electrically connected" to other layer, region, or element with other layer, region, or element interposed therebetween.

The x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

FIG. 1 is a schematic perspective view of a display apparatus 1 according to some embodiments.

Referring to FIG. 1, the display apparatus 1 may include a display area DA and a non-display area NDA outside (e.g., in a periphery or outside a footprint of) the display area DA. The display area DA may be configured to display images through sub-pixels P arranged in the display area DA. The non-display area NDA is arranged outside the display area DA and does not display images. The non-display area NDA may surround the display area DA entirely. A driver and the like configured to provide electric signals or power to the display area DA may be arranged in the non-display area NDA. A pad may be arranged in the non-display area NDA, wherein the pad is a region to which electronic elements or a printed circuit board may be electrically connected.

According to some embodiments, although it is shown in FIG. 1 that the display area DA is a polygon (e.g., a quadrangle) in which a length thereof in an x direction is less than a length thereof in a y direction, the embodiments according to the present disclosure are not limited thereto. According to some embodiments, the display area DA may have various shapes such as an N-gon (where N is a natural number of 3 or more), a circle, or an ellipse. Although it is shown in FIG. 1 that the display area DA has a shape in which a corner of the display area DA includes a vertex at which a straight line meets a straight line, the display area DA may have a polygon shape having round corners.

Hereinafter, for convenience of description, although the case where the display apparatus 1 is a smartphone is described, the display apparatus 1 according to the present disclosure is not limited thereto. The display apparatus 1 is applicable to, and may be utilized within, various products including, for example, televisions, notebook computers, monitors, advertisement boards, Internet of things (IoTs) as well as portable electronic apparatuses including mobile phones, smartphones, tablet personal computers (PCs), mobile communication terminals, electronic organizers, electronic books, portable multimedia players (PMPs), navigations, and ultra mobile personal computers (UMPCs).

In addition, the display apparatus 1 according to some embodiments is applicable to and may be utilized within wearable devices including smartwatches, watchphones, glasses-type displays, and head-mounted displays (HMD). In addition, according to some embodiments, the display apparatus 1 is applicable to a display screen in instrument panels for automobiles, center fascias for automobiles, or center information displays (CIDs) arranged on a dashboard, room mirror displays that replace side mirrors of automobiles, and displays of an entertainment system arranged on the backside of front seats for backseat passengers in automobiles.

Figure 2:
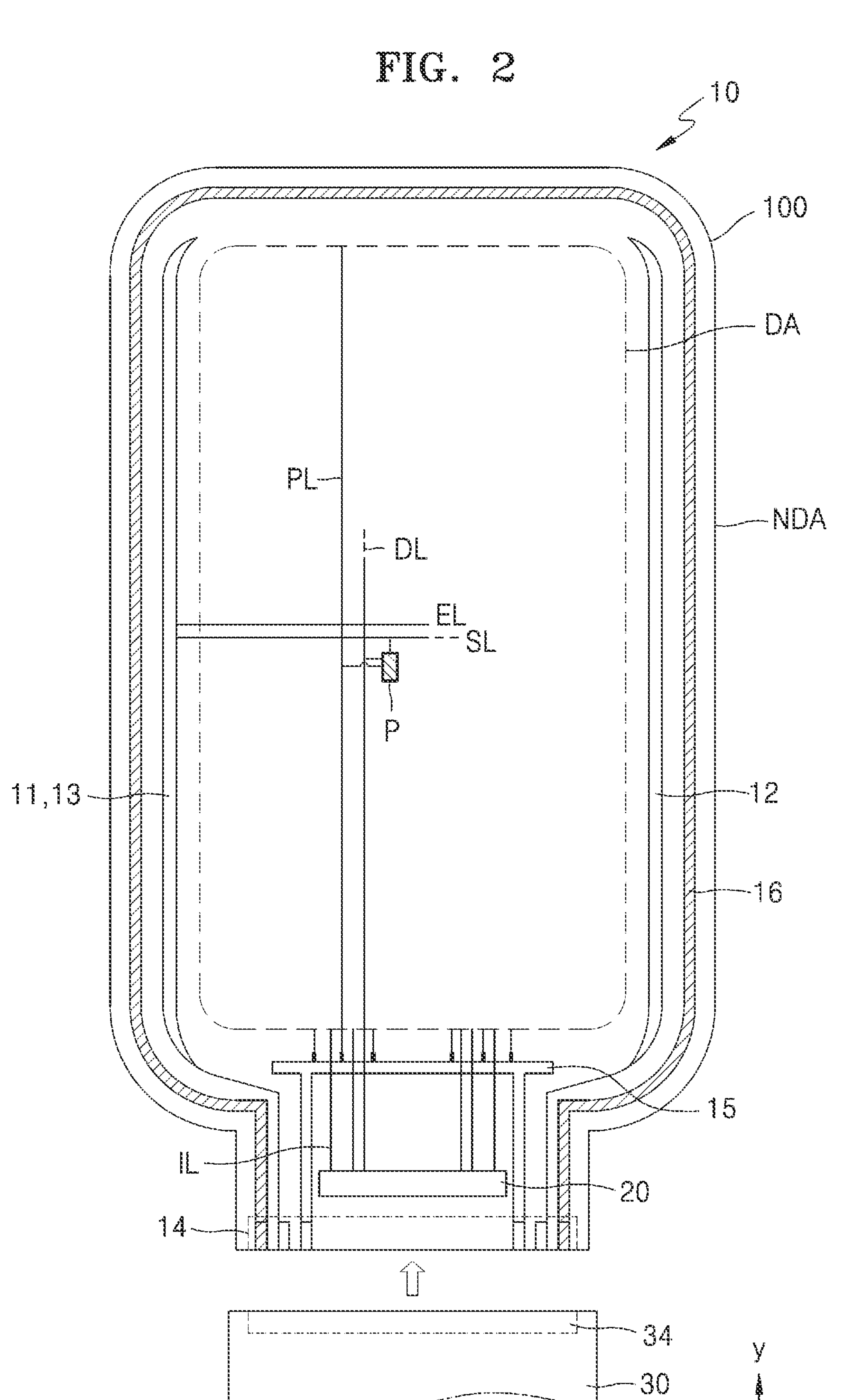
FIG. 2 is a schematic plan view of a display panel of the display apparatus according to some embodiments.

FIG. 2 is a schematic plan view of a display panel 10 of the display apparatus 1 according to some embodiments. FIG. 2 may be understood as a substrate 100 of the display panel 10.

Referring to FIG. 2, the display panel 10 may include the display area DA and the non-display area NDA outside the display area DA. The display area DA is a portion configured to display images, and a plurality of sub-pixels P may be arranged in the display area DA. Although it is shown in FIG. 2 that the display area DA has an approximately rectangular shape having round edges, the embodiments according to the present disclosure are not limited thereto. As described above, the display area DA may have various shapes such as an N-gon (where N is a natural number of 3 or more), a circle, or an ellipse.

Each of the sub-pixels P may include a display element such as an organic light-emitting diode OLED. Each sub-pixel P may emit light, for example, red, green, blue, or white light.

The non-display area NDA may be arranged outside the display area DA. Outer circuits may be arranged in the non-display area NDA, wherein the outer circuits drive the sub-pixels P. A first scan driving circuit 11, a second scan driving circuit 12, an emission control driving circuit 13, a terminal 14, a driving power supply line 15, and a common power supply line 16 may be arranged in the non-display area NDA.

The first scan driving circuit 11 may be configured to provide scan signals to the sub-pixel P through a scan line SL. The second scan driving circuit 12 may be arranged in parallel to the first scan driving circuit 11 with the display area DA therebetween. Some of the sub-pixels P arranged in the display area DA may be electrically connected to the first scan driving circuit 11, and the others may be connected to the second scan driving circuit 12. According to some embodiments, the second scan driving circuit 12 may be omitted, and all of the sub-pixels arranged in the display area DA may be electrically connected to the first scan driving circuit 11.

The emission control driving circuit 13 may be arranged on the side of the first scan driving circuit 11 and configured to provide emission control signals to the sub-pixels P through an emission control line EL. Although it is shown in FIG. 1 that the emission control driving circuit 13 is arranged on only one side of the display area DA, like the first scan driving circuit 11 and the second scan driving circuit 12, the emission control driving circuits 13 may be respectively arranged on two opposite sides of the display area DA.

A driving chip 20 may be arranged in the non-display area NDA. The driving chip 20 may include an integrated circuit configured to drive the display panel 10. Although the integrated circuit may be a data driving integrated circuit configured to generate data signals, the embodiments according to the present disclosure are not limited thereto.

The terminal 14 may be arranged in the non-display area NDA. The terminal 14 may be exposed by not being covered by an insulating layer, and may be electrically connected to a printed circuit board 30. A terminal 34 of the printed circuit board 30 may be electrically connected to the terminal 14 of the display panel 10.

The printed circuit board 30 is configured to transfer signals of a controller or power from a power source to the display panel 10. Control signals generated by the controller may be respectively transferred to the driving circuits through the printed circuit board 30. In addition, the controller may be configured to transfer a driving voltage ELVDD to the driving power supply line 15 and transfer a common voltage ELVSS to the common power supply line 16.

The driving voltage ELVDD may be transferred to each sub-pixel P through a driving voltage line PL connected to the driving power supply line 15, and the common voltage ELVSS may be transferred to an opposite electrode of the sub-pixel P through a common voltage electrode VSL (see FIG. 6) connected to the common power supply line 16. The driving power supply line 15 may have a shape extending in one direction (e.g., an x-axis direction) below the display area DA. The common power supply line 16 may have a loop shape having one open side and have a shape partially surrounding the display area DA. For example, the common power supply line 16 may extend from one side or edge of the terminal 14 and loop around the display area DA, within the non-display area NDA, and return to another side or edge of the terminal 14.

The controller is configured to generate data signals, and the generated data signals are transferred to an input line IL through the driving chip 20 and transferred to the sub-pixel P through a data line DL connected to the input line IL. For reference, a "line" may mean a "wiring". This is also applicable to embodiments below and modifications thereof.

Figure 3:
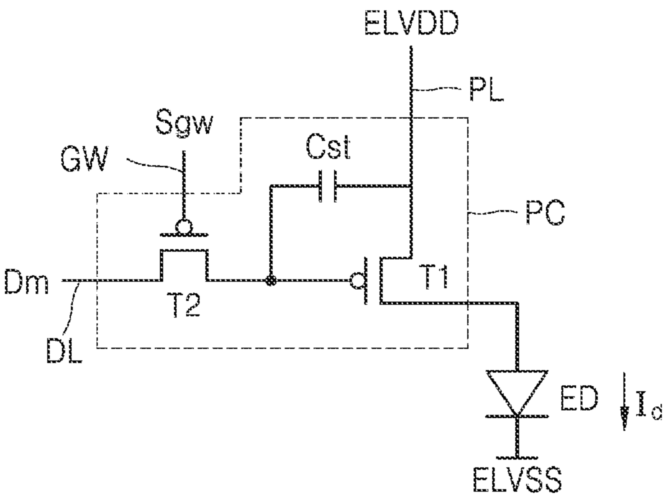
FIGS. 3 and 4 are schematic equivalent circuit diagrams of a light-emitting diode corresponding to one of sub-pixels of a display apparatus and a sub-pixel circuit connected to a relevant light-emitting diode, according to some embodiments.
Figure 4:
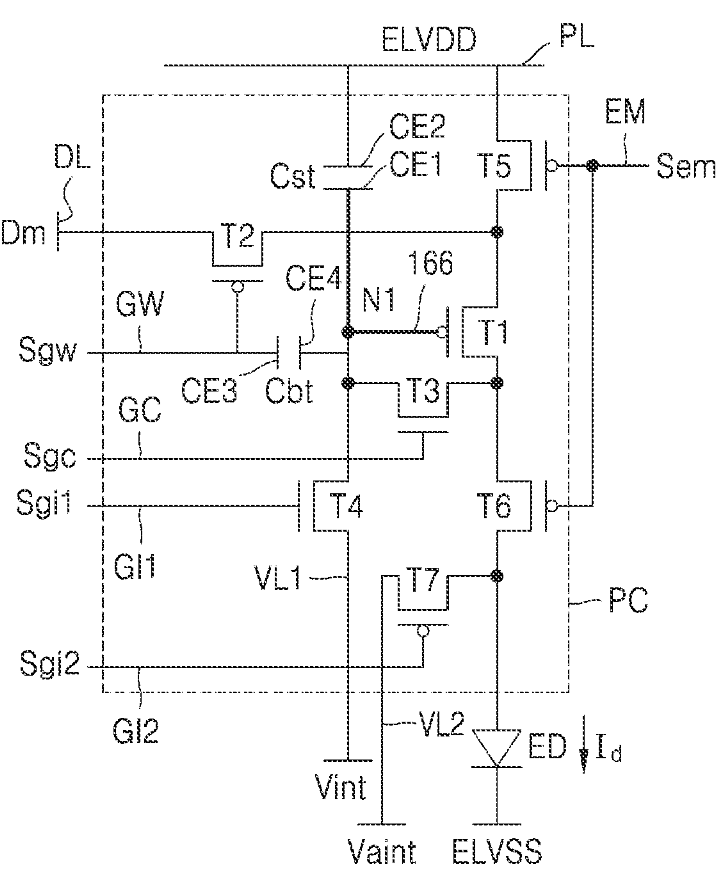

FIGS. 3 and 4 are schematic equivalent circuit diagrams of a light-emitting diode corresponding to one of sub-pixels of the display apparatus 1 and a sub-pixel circuit connected to a relevant light-emitting diode, according to some embodiments.

Referring to FIG. 3, a light-emitting diode ED may be electrically connected to a sub-pixel circuit PC, and the sub-pixel circuit PC may include a first transistor T1, a second transistor T2, and a storage capacitor Cst. The sub-pixel circuit PC is not limited to the components illustrated in FIG. 3, however, and in some embodiments the sub-pixel circuit PC may include additional components without departing from the spirit and scope of embodiments according to the present disclosure.

The second transistor T2 is configured to transfer a data signal Dm to the first transistor T1 according to a scan signal Sgw input through a scan line GW, wherein the data signal Dm is input through the data line DL.

The storage capacitor Cst may be connected to the second transistor T2 and the driving voltage line PL and may be configured to store a voltage corresponding to a difference between a voltage transferred from the second transistor T2 and the driving voltage ELVDD supplied to the driving voltage line PL.

The first transistor T1 may be connected to the driving voltage line PL and the storage capacitor Cst and configured to control a driving current Id according to the voltage stored in the storage capacitor Cst, the driving current Id flowing from the driving voltage line PL to the light-emitting diode ED. An opposite electrode (e.g., a cathode) of the light-emitting diode ED may be configured to receive the common voltage ELVSS. The light-emitting diode ED may emit light having a brightness or luminance (e.g., a preset brightness) corresponding to the driving current Id.

Although it is described with reference to FIG. 3 that the sub-pixel circuit PC includes two transistors and one storage capacitor, the embodiments according to the present disclosure are not limited thereto.

Referring to FIG. 4, the sub-pixel circuit PC may include seven transistors and two capacitors. Embodiments according to the present disclosure are not limited thereto, however. For example, the sub-pixel circuit PC may include additional components or fewer components, without departing from the spirit and scope of embodiments according to the present disclosure.

The sub-pixel circuit PC may include first to seventh transistors T1, T2, T3, T4, T5, T6, and T7, a storage capacitor Cst, and a boost capacitor Cbt. According to some embodiments, the sub-pixel circuit PC may not include the boost capacitor Cbt.

Some of the transistors T1, T2, T3, T4, T5, T6, and T7 may be n-channel metal oxide semiconductor (NMOS) field-effect transistors (n-channel MOSFETs), and the rest may be p-channel metal oxide semiconductor (PMOS) field-effect transistors (p-channel MOSFETs). According to some embodiments, the third, fourth, and seventh transistors T3, T4, and T7 may be n-channel MOSFETs, and the rest may be p-channel MOSFETs.

The first to seventh transistors T1, T2, T3, T4, T5, T6, and T7, the storage capacitor Cst, and the boost capacitor Cbt may be connected to signal lines. The signal lines may include an emission control line EM, a compensation gate line GC, a first initialization gate line GI1, a second initialization gate line GI2, and the data line DL. The sub-pixel circuit PC may be electrically connected to voltage lines, for example, the driving voltage line PL, a first initialization voltage line VL1, and a second initialization voltage line VL2.

The first transistor T1 may be a driving transistor. A first gate electrode of the first transistor T1 may be connected to the storage capacitor Cst, a first electrode of the first transistor T1 may be electrically connected to the driving voltage line PL through the fifth transistor T5, and a second electrode of the first transistor T1 may be electrically connected to a pixel electrode (e.g., an anode) of the light-emitting diode ED through the sixth transistor T6. One of the first electrode and the second electrode of the first transistor T1 may be a source electrode, and the other may be a drain electrode. The first transistor T1 may be configured to supply the driving current Id to the light-emitting diode ED according to a switching operation of the second transistor T2.

The second transistor T2 may be a switching transistor. A second gate electrode of the second transistor T2 is connected to the scan line GW, a first electrode of the second transistor T2 is connected to the data line DL, and a second electrode of the second transistor T2 is connected to the first electrode of the first transistor T1 and electrically connected to the driving voltage line PL through the fifth transistor T5. One of the first electrode and the second electrode of the second transistor T2 may be a source electrode, and the other may be a drain electrode. The second transistor T2 may be turned on according to a scan signal Sgw transferred through the scan line GW. The second transistor T2 may perform a switching operation of transferring a data signal Dm to the first electrode of the first transistor T1, wherein the data signal Dm is transferred through the data line DL.

The third transistor T3 may be a compensation transistor configured to compensate for a threshold voltage of the first transistor T1. A third gate electrode of the third transistor T3 is connected to a compensation gate line GC. A first electrode of the third transistor T3 is connected to the lower electrode CE1 of the storage capacitor Cst. The first electrode of the third transistor T3 is further connected to the first gate electrode of the first transistor T1 through a node connection line 166. The first electrode of the third transistor T3 may be connected to the fourth transistor T4. A second electrode of the third transistor T3 is connected to the second electrode of the first transistor T1 and electrically connected to the pixel electrode (e.g., the anode) of the light-emitting diode ED through the sixth transistor T6. One of the first electrode and the second electrode of the third transistor T3 may be a source electrode, and the other may be a drain electrode.

The third transistor T3 is turned on according to a compensation signal Sgc transferred through the compensation gate line GC, and diode-connects the first transistor T1 by electrically connecting the first gate electrode of the first transistor T1 to the second electrode (e.g., the drain electrode) of the first transistor T1 through the node connection line 166.

The fourth transistor T4 may be a first initialization transistor configured to initialize the first gate electrode of the first transistor T1. A fourth gate electrode of the fourth transistor T4 is connected to a first initialization gate line GI1. A first electrode of the fourth transistor T4 is connected to a first initialization voltage line VL1 configured to receive a first initialization voltage Vint. A second electrode of the fourth transistor T4 may be connected to the lower electrode CE1 of the storage capacitor Cst, the first electrode of the third transistor T3, and the first gate electrode of the first transistor T1. One of the first electrode and the second electrode of the fourth transistor T4 may be a source electrode, and the other may be a drain electrode. The fourth transistor T4 may be turned on according to a first initialization signal Sgi1 transferred through the first initialization gate line Gil and may perform an initialization operation of initializing the voltage of the first gate electrode of the first transistor T1 by transferring a first initialization voltage Vint to the first gate electrode of the driving transistor T1.

The fifth transistor T5 may operate as an operation control transistor. A fifth gate electrode of the fifth transistor T5 is connected to the emission control line EM, a first electrode of the fifth transistor T5 is connected to the driving voltage line PL, and a second electrode of the fifth transistor T5 is connected to the first electrode of the first transistor T1 and the second electrode of the second transistor T2. One of the first electrode and the second electrode of the fifth transistor T5 may be a source electrode, and the other may be a drain electrode.

The sixth transistor T6 may operate as an emission control transistor. A sixth gate electrode of the sixth transistor T6 is connected to the emission control line EM, a first electrode of the sixth transistor T6 is connected to the second electrode of the first transistor T1 and the second electrode of the third transistor T3, and a second electrode of the sixth transistor T6 is electrically connected to a second electrode of the seventh transistor T7 and the pixel electrode (e.g., the anode) of the light-emitting diode ED. One of the first electrode and the second electrode of the sixth transistor T6 may be a source electrode, and the other may be a drain electrode.

The fifth transistor T5 and the sixth transistor T6 may be simultaneously (or concurrently) turned on according to an emission control signal Sem transferred through the emission control line EM. Thus, the fifth gate electrode of the fifth transistor T5 and the sixth gate electrode of the sixth transistor T6 may be electrically connected to each other. In response to the fifth transistor T5 and the sixth transistor T6 being turned on, the driving voltage ELVDD is transferred to the light-emitting diode ED, and the driving current Id flows through the light-emitting diode ED.

The seventh transistor T7 may be a second initialization transistor configured to initialize the pixel electrode of the light-emitting diode ED. A seventh gate electrode of the seventh transistor T7 is connected to a second initialization gate line GI2. A first electrode of the seventh transistor T7 is connected to a second initialization voltage line VL2. A second electrode of the seventh transistor T7 is connected to the second electrode of the sixth transistor T6 and the pixel electrode (e.g., the anode) of the light-emitting diode ED. The seventh transistor T7 may be turned on according to a second initialization signal Sgi2 transferred through the second initialization gate line GI2, and configured to initialize the pixel electrode of the light-emitting diode ED by transferring a second initialization voltage Vaint to the pixel electrode (e.g., the anode) of the light-emitting diode ED.

According to some embodiments, the second initialization gate line GI2 may be a next scan line. As an example, the second initialization gate line GI2 connected to the seventh transistor T7 of the sub-pixel circuit PC and arranged in an i-th row (i is a natural number) may correspond to a scan line of the sub-pixel circuit PC arranged in an (i+1)-th row. According to some embodiments, the second initialization gate line GI2 may be the emission control line EM. As an example, the emission control line EM may be electrically connected to the fifth to seventh transistors T5, T6, and T7.

The storage capacitor Cst includes a lower electrode CE1 and an upper electrode CE2. The lower electrode CE1 of the storage capacitor Cst is connected to the first gate electrode of the first transistor T1, and the upper electrode CE2 of the storage capacitor Cst is connected to the driving voltage line PL. The storage capacitor Cst may be configured to store charge corresponding to a difference between a voltage of the first gate electrode of the first transistor T1 and the driving voltage ELVDD.

The boost capacitor Cbt includes a third electrode CE3 and a fourth electrode CE4. The third electrode CE3 may be connected to the second gate electrode of the second transistor T2 and the scan line GW, and the fourth electrode CE4 may be connected to the first electrode of the third transistor T3 and the node connection line 166. The boost capacitor Cbt may raise the voltage of a first node N1 when a scan signal Sgw supplied to the scan line GW is turned off. When the voltage of the first node N1 is raised, a black grayscale may be clearly expressed.

The first node N1 may be a region where the first gate electrode of the first transistor T1, the first electrode of the third transistor T3, the second electrode of the fourth transistor T4, and the fourth electrode CE4 of the boost capacitor Cbt are connected to each other.

According to some embodiments, it is described in FIG. 4 that the third and fourth transistors T3 and T4 are n-channel MOSFETs, and the first, second, fifth to seventh transistors T1, T2, T5, T6, and T7 are p-channel MOSFETs. The first transistor T1 directly influencing the brightness of the display apparatus displaying images may be configured to include a semiconductor layer including polycrystalline silicon having high reliability, and thus, a high-resolution display apparatus may be implemented through this configuration.

Figure 5A:
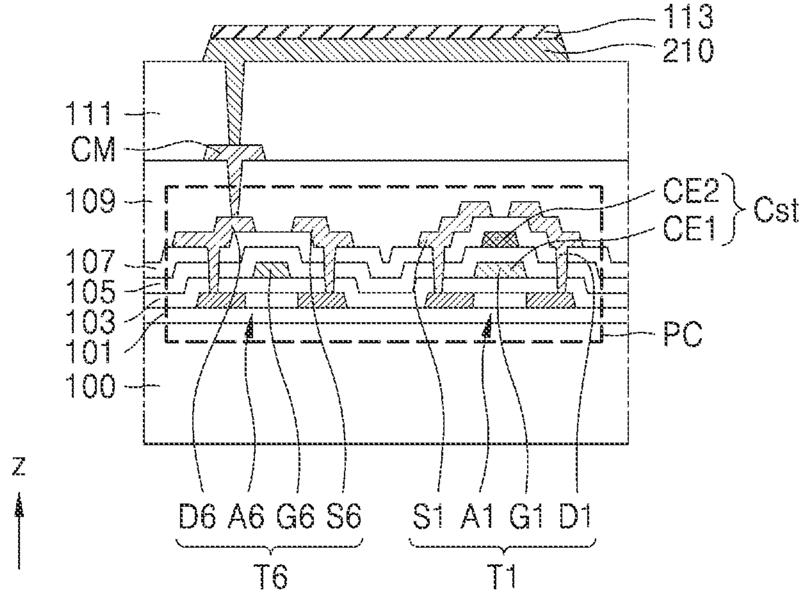
FIGS. 5A to 5J are cross-sectional views showing a process of manufacturing a sub-pixel of a display apparatus, according to some embodiments.
Figure 5B:
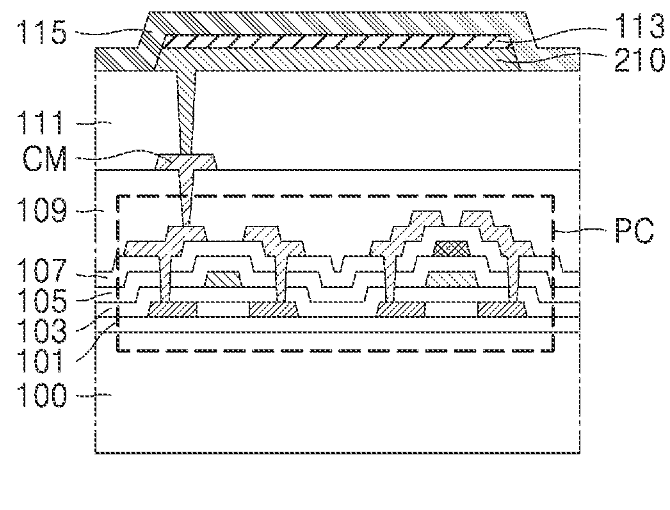
Figure 5C:
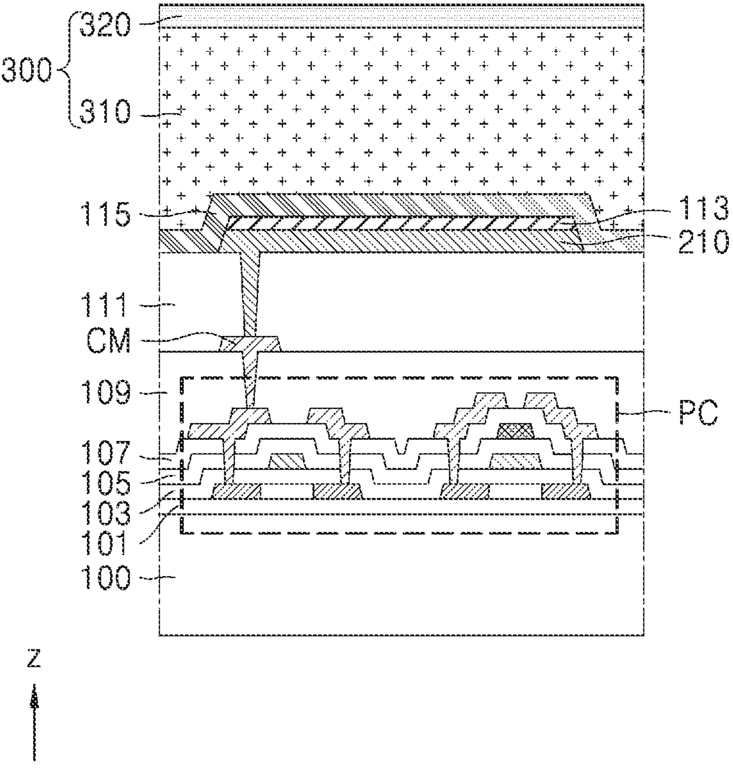
Figure 5D:
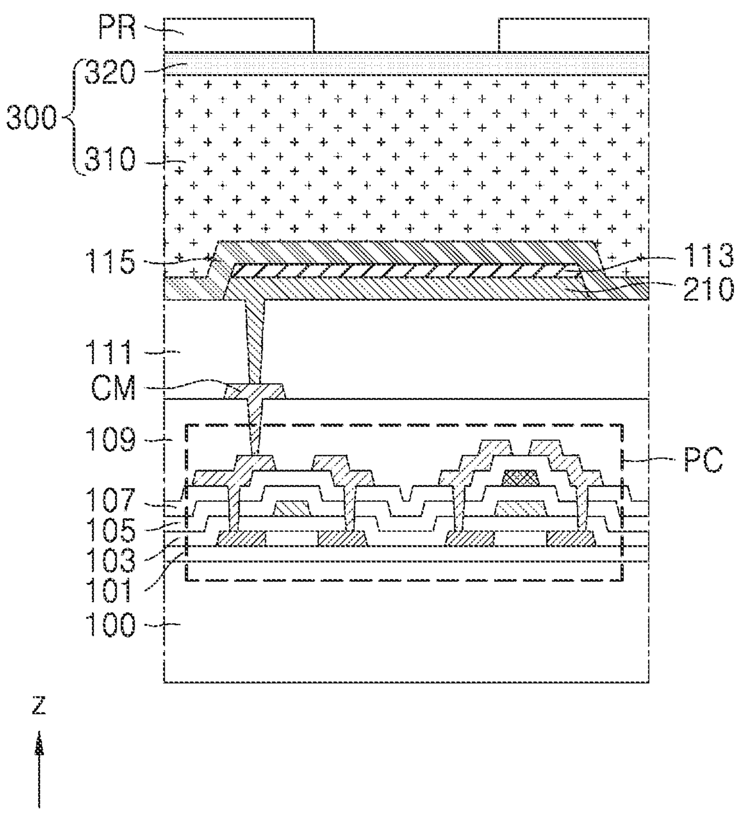
Figure 5E:
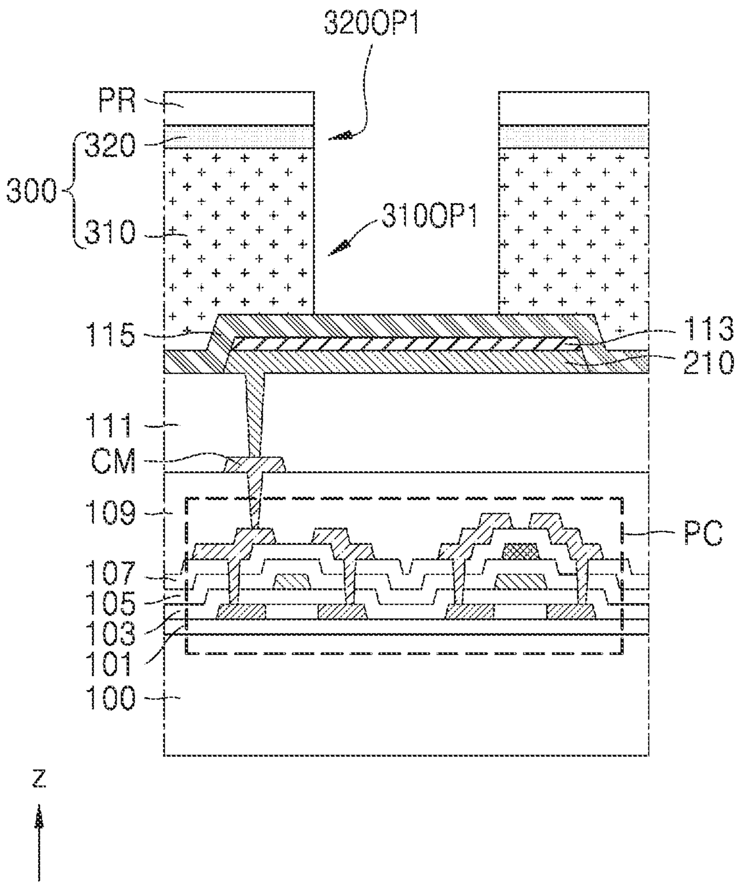
Figure 5F:
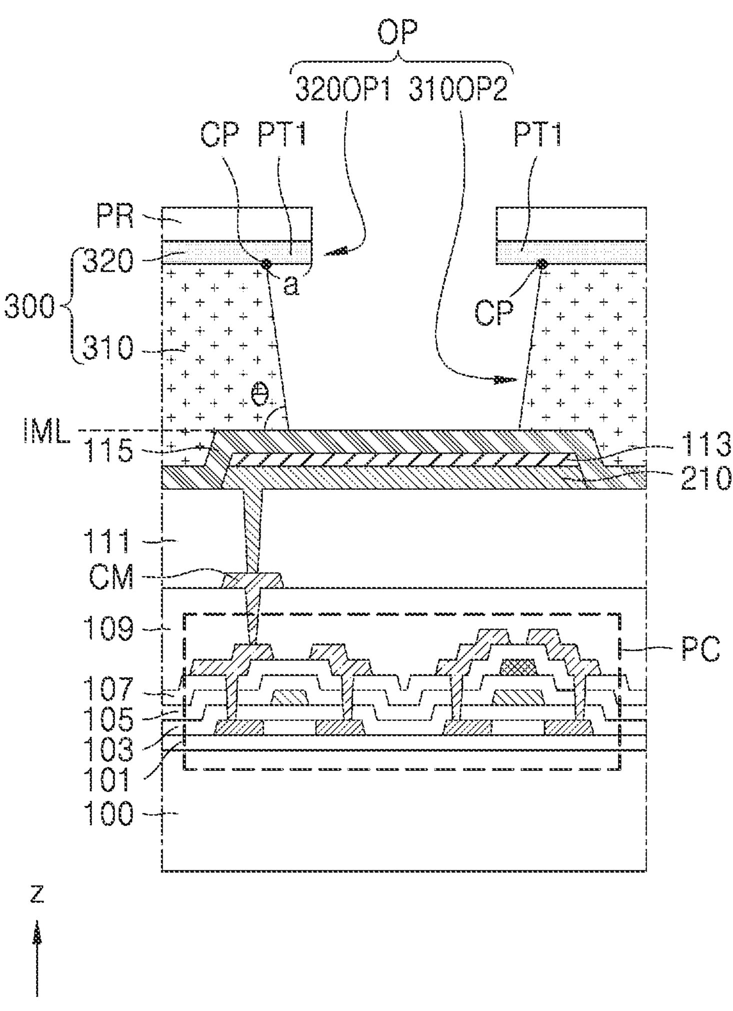
Figure 5G:
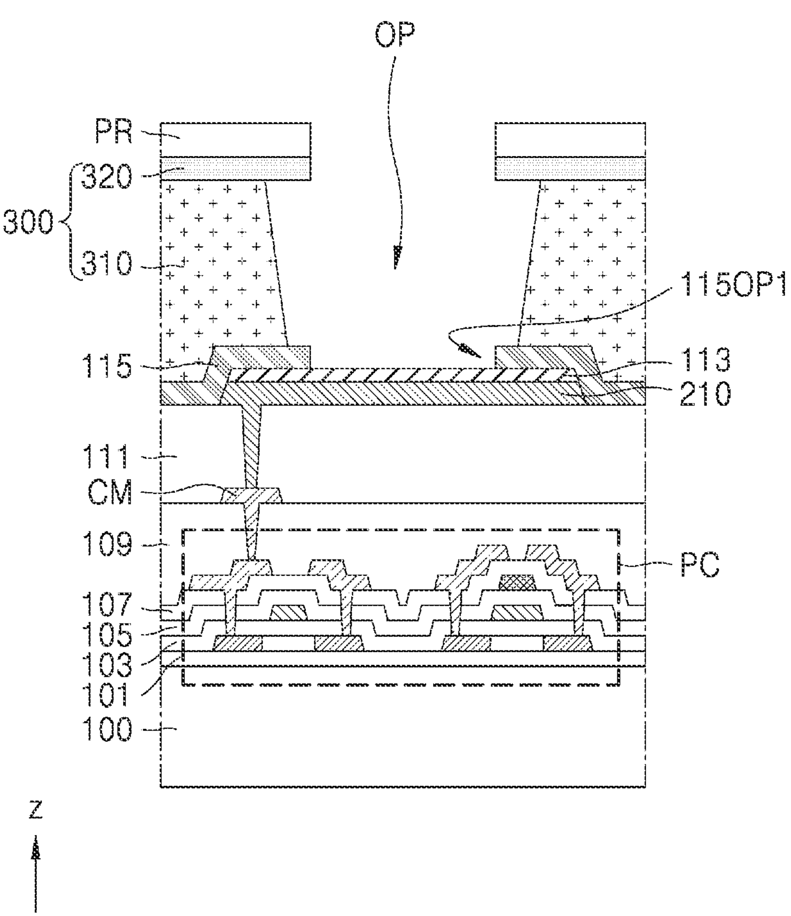
Figure 5H:
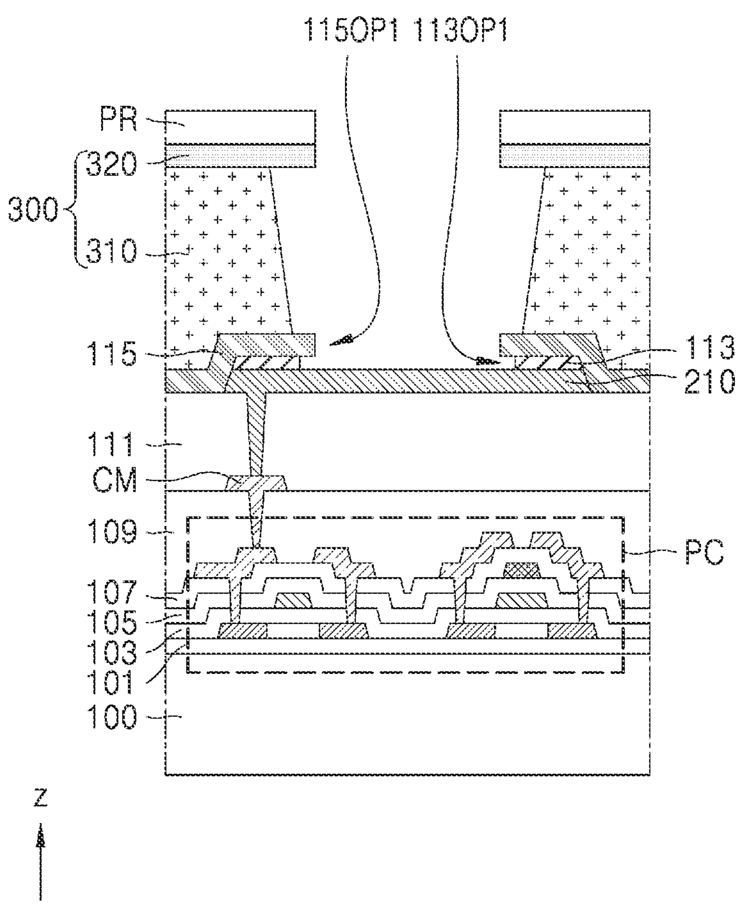
Figure 5I:
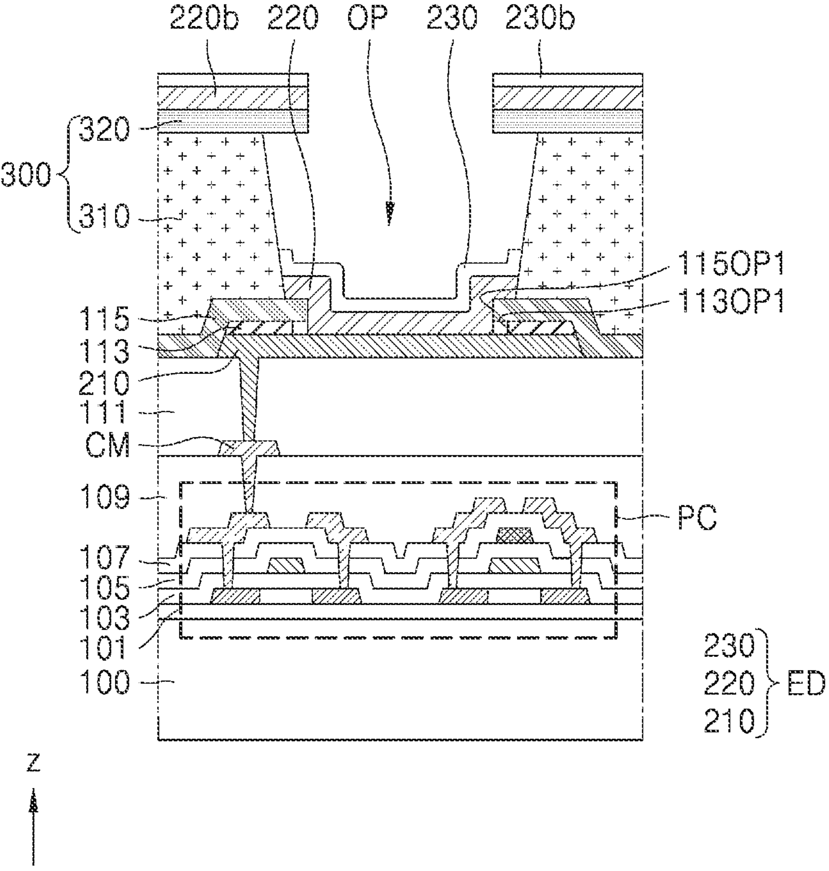
Figure 5J:
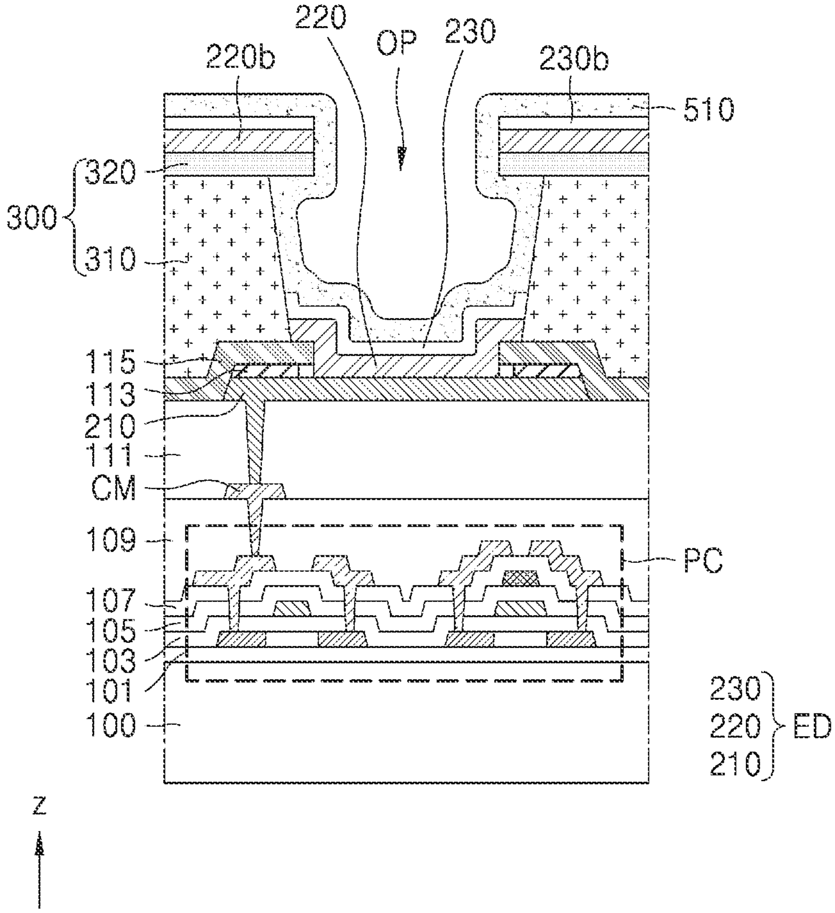
Figure 5K:
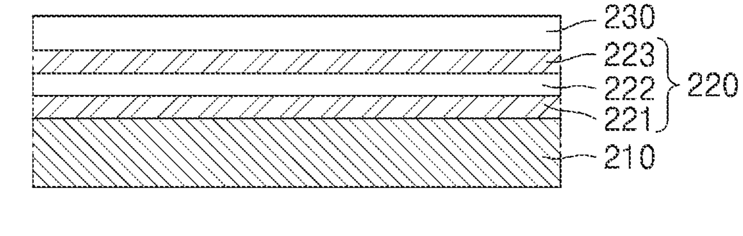
FIG. 5K is a cross-sectional view of a stack structure of a light-emitting diode according to some embodiments.

FIGS. 5A to 5J are cross-sectional views showing a process of manufacturing a sub-pixel of the display apparatus 1 according to some embodiments, and FIG. 5K is a cross-sectional view of a stack structure of a light-emitting diode according to some embodiments.

Referring to FIG. 5A, the sub-pixel circuit PC may be formed on the substrate 100. The substrate 100 may include glass or polymer resin. The substrate 100 may have a structure in which a base layer including polymer resin and an inorganic barrier layer are stacked. The polymer resin may include a polymer resin such as polyethersulphone (PES), polyacrylate (PAR), polyetherimide (PEI), polyethylene naphthalate (PEN), polyethylene terephthalate (PET), polyphenylene sulfide (PPS), polyarylate, polyimide (PI), polycarbonate, cellulose tri acetate (TAC), cellulose acetate propionate (CAP), and the like.

A buffer layer 101 may be located on the upper surface of the substrate 100. The buffer layer 101 may prevent or reduce instances of contaminants or impurities penetrating a semiconductor layer of a transistor. The buffer layer 101 may include an inorganic insulating material such as silicon nitride, silicon oxynitride, and silicon oxide, and include a single layer or a multi-layer including the above inorganic insulating materials.

The sub-pixel circuit PC may be located on the buffer layer 101. As described above with reference to FIG. 3 or 4, the sub-pixel circuit PC may include the plurality of transistors and the storage capacitor. According to some embodiments, FIG. 5A shows the first transistor T1, the sixth transistor T6, and the storage capacitor Cst of the sub-pixel circuit PC.

The first transistor T1 may include a first semiconductor layer A1 and a first gate electrode G1, wherein the first semiconductor layer A1 is on the buffer layer 101, and the first gate electrode G1 overlaps a channel region of the first semiconductor layer A1. The first semiconductor layer A1 may include a silicon-based semiconductor material, for example, polycrystalline silicon. The first semiconductor layer A1 may include a channel region, a first region, and a second region, the first region and the second region being respectively on two opposite sides of the channel region. The first region and the second region are regions including impurities of higher concentration than that of the channel region. One of the first region and the second region may correspond to a source region, and the other may correspond to a drain region, with the channel region of the first transistor T1 between the source and drain regions.

The sixth transistor T6 may include a sixth semiconductor layer A6 and a sixth gate electrode G6, wherein the sixth semiconductor layer A6 is on the buffer layer 101, and the sixth gate electrode G6 overlaps a channel region of the sixth semiconductor layer A6. The sixth semiconductor layer A6 may include a silicon-based semiconductor material, for example, polycrystalline silicon. The sixth semiconductor layer A6 may include a channel region, a first region, and a second region, the first region and the second region being on two opposite sides of the channel region. The first region and the second region are regions including impurities of higher concentration than that of the channel region. One of the first region and the second region may correspond to a source region, and the other may correspond to a drain region, with the channel region of the sixth transistor T6 between the source and drain regions.

The first gate electrode G1 and the sixth gate electrode G6 may include any suitable conductive material including, for example, molybdenum (Mo), aluminum (Al), copper (Cu), and titanium (Ti) and have a single-layered structure or a multi-layered structure including the above materials.

A first gate insulating layer 103 may be located below the first gate electrode G1 and the sixth gate electrode G6, wherein the first gate insulating layer 103 is for electrical insulation between the first semiconductor layer A1 and the first gate electrode G1 and between the sixth semiconductor layer A6 and the sixth gate electrode G6. The first gate insulating layer 103 may include an inorganic insulating material such as silicon nitride, silicon oxynitride, and silicon oxide, and include a single layer or a multi-layer including the above inorganic insulating materials.

The storage capacitor Cst may include the lower electrode CE1 and the upper electrode CE2 overlapping each other. According to some embodiments, the lower electrode CE1 of the storage capacitor Cst may include the first gate electrode G1. In other words, the first gate electrode G1 may include the lower electrode CE1 of the storage capacitor Cst. As an example, the first gate electrode G1 and the lower electrode CE1 of the storage capacitor Cst may be one body.

A first interlayer insulating layer 105 may be located between the lower electrode CE1 and the upper electrode CE2 of the storage capacitor Cst. The first interlayer insulating layer 105 may include any suitable insulating material, for example, an inorganic insulating material such as silicon nitride, silicon oxynitride, and silicon oxide, and include a single-layered structure or a multi-layered structure including the above-described insulating materials (e.g., inorganic insulating materials).

The upper electrode CE2 of the storage capacitor Cst may include any suitable conductive material of a low-resistance material such as molybdenum (Mo), aluminum (Al), copper (Cu) and/or titanium (Ti), and have a single-layered structure or a multi-layered structure including, for example, the above-described materials.

A second interlayer insulating layer 107 may be located on the storage capacitor Cst. The second interlayer insulating layer 107 may include an inorganic insulating material such as silicon nitride, silicon oxynitride, and silicon oxide, and include a single-layered structure or a multi-layered structure including the above inorganic insulating materials.

A source electrode S1 and/or a drain electrode D1 may be located on the second interlayer insulating layer 107, the source electrode S1 and/or the drain electrode D1 being electrically connected to the first semiconductor layer A1 of the first transistor T1. A source electrode S6 and/or a drain electrode D6 may be located on the second interlayer insulating layer 107, the source electrode S6 and/or the drain electrode D6 being electrically connected to the sixth semiconductor layer A6 of the sixth transistor T6. The source electrodes S1 and S6 and/or the drain electrodes D1 and D6 may include aluminum (Al), copper (Cu), and/or titanium (Ti), and include a single layer or a multi-layer including the above materials.

A first organic insulating layer 109 may be located on the sub-pixel circuit PC. The first organic insulating layer 109 may include an organic insulating material such as acryl, benzocyclobutene (BCB), polyimide, or hexamethyldisiloxane (HMDSO).

A connection metal CM may be located on the first organic insulating layer 109. The connection metal CM may include aluminum (Al), copper (Cu), and/or titanium (Ti), and include a single layer or a multi-layer including the above materials.

A second organic insulating layer 111 may be located between the connection metal CM and the sub-pixel electrode 210. The second organic insulating layer 111 may include an organic insulating material such as acryl, benzocyclobutene (BCB), polyimide, or hexamethyldisiloxane (HMDSO). According to some embodiments as described with reference to FIG. 5A, although the sub-pixel circuit PC is electrically connected to the sub-pixel electrode 210 through the connection metal CM, the connection metal CM may be omitted and one organic insulating layer may be located between the sub-pixel circuit PC and the sub-pixel electrode 210 according to some embodiments. In addition, three or more organic insulating layers may be located between the sub-pixel circuit PC and the sub-pixel electrode 210, and the sub-pixel circuit PC is electrically connected to the sub-pixel electrode 210 through a plurality of connection metals.

The sub-pixel electrode 210 may be formed on the second organic insulating layer 111. The sub-pixel electrode 210 may be formed to be a (semi) transparent electrode or formed to be a reflective electrode. In the case where the sub-pixel electrode 210 is formed to be a (semi) transparent electrode, the sub-pixel electrode 210 may include indium tin oxide (ITO), indium zinc oxide (IZO), zinc oxide (ZnO), indium oxide ($In_2O_3$), indium gallium oxide (IGO), or aluminum zinc oxide (AZO). In the case where the sub-pixel electrode 210 is formed to be a reflective electrode, the sub-pixel electrode 210 may include a reflective layer including, for example, Ag, Mg, Al, Pt, Pd, Au, Ni, Nd, Ir, Cr, or a compound thereof, and a layer on the reflective layer, the layer including, for example, a transparent or light-transmitting conductive material such as ITO, IZO, ZnO or $In_2O_3$. According to some embodiments, the sub-pixel electrode 210 may have a structure of an ITO layer, an Ag layer, and an ITO layer that are sequentially stacked. The sub-pixel electrode 210 may be electrically connected to the connection metal CM through a contact hole of the second organic insulating layer 111.

A protective layer 113 may be formed on the sub-pixel electrode 210. The protective layer 113 may be formed together with the sub-pixel electrode 210. As an example, the sub-pixel electrode 210 and the protective layer 113 may be formed by using the same mask. The protective layer 113 may prevent or reduce damage to the sub-pixel electrode 210 from a gas, a liquid material, or the like used in various etching processes or ashing processes included in the process of manufacturing the display apparatus. The protective layer 113 may include a conductive oxide such as indium tin oxide (ITO), indium zinc oxide (IZO), indium gallium zinc oxide (IGZO), indium tin zinc oxide (ITZO), zinc oxide (ZnO), aluminum doped zinc oxide (AZO), gallium doped zinc oxide (GZO), zinc tin oxide (ZTO), gallium tin oxide (GTO), and fluorine doped tin oxide (FTO).

Referring to FIG. 5B, an insulating layer 115 may be formed on the structure shown in FIG. 5A. The insulating layer 115 may be formed on the substrate 100 entirely. As an example, the insulating layer 115 may overlap the sub-pixel electrode 210 and the protective layer 113 and directly contact the upper surface of the second organic insulating layer 111 where the sub-pixel electrode 210 and the protective layer 113 are not present. The insulating layer 115 may cover the lateral surface of each of the sub-pixel electrode 210 and the protective layer 113. The insulating layer 115 may include any suitable insulating material, for example, an inorganic insulating material. In the case where the insulating layer 115 includes an inorganic insulating material, deterioration of the quality of the light-emitting diode may be prevented or reduced due to a gas emitted from an insulating layer, which is an organic insulating material, during the process of manufacturing the display apparatus compared to the case where the insulating layer 115 includes an organic insulating material.

The insulating layer 115 may include an inorganic insulating material such as silicon nitride, silicon oxynitride, and silicon oxide, and include a single-layered structure or a multi-layered structure including the above inorganic insulating materials. According to some embodiments, the insulating layer 115 may have a two-layered structure of a silicon oxide layer and a silicon nitride layer. The thickness of the silicon oxide layer may be less than the thickness of the silicon nitride layer. According to some embodiments, the thickness of the insulating layer 115 may be less than the thickness of the protective layer 113. As an example, although the thickness of the insulating layer 115 may be about 1000 Å, and the thickness of the protective layer 113 may be about 500 Å, the embodiments according to the present disclosure are not limited thereto.

Referring to FIG. 5C, a metal bank layer 300 may be formed on the insulating layer 115 shown in FIG. 5B. The metal bank layer 300 may include a first metal layer 310 and a second metal layer 320 on the first metal layer 310.

The first metal layer 310 and the second metal layer 320 may include different metals. As an example, the first metal layer 310 and the second metal layer 320 may include metals with different etching selectivities. According to some embodiments, the first metal layer 310 may include a layer including aluminum (Al), and the second metal layer 320 may include a layer including titanium (Ti).

The thickness of the first metal layer 310 may be greater than the thickness of the second metal layer 320. According to some embodiments, the thickness of the first metal layer 310 may be greater than about 5 times the thickness of the second metal layer 320. According to some embodiments, the thickness of the first metal layer 310 may be greater than about 6 times, greater than about 7 times, or greater than about 8 times the thickness of the second metal layer 320. According to some embodiments, the thickness of the first metal layer 310 may be about 4000 Å to about 8000 Å, and the thickness of the second metal layer 320 may be about 500 Å to about 800 Å. The thickness of the first metal layer 310 may be about 4 times or more, about 5 times or more, or about 6 times or more of the thickness of the insulating layer 115.

Referring to FIG. 5D, a photoresist PR is formed on the metal bank layer 300. The photoresist PR may include an opening overlapping the sub-pixel electrode 210 and the protective layer 113. A portion of the upper surface of the metal bank layer 300 may be exposed through the opening of the photoresist PR.

Referring to FIG. 5E, a portion of the metal bank layer 300, for example, a portion of the second metal layer 320 and a portion of the first metal layer 310 may be removed using the photoresist PR as a mask. As an example, a portion of the second metal layer 320 and a portion of the first metal layer 310 may be sequentially removed through the opening of the photoresist PR. A portion of the second metal layer 320 and a portion of the first metal layer 310 may be removed by dry etching. During the etching process, the insulating layer 115 and the protective layer 113 may be configured to protect the sub-pixel electrode thereunder.

By the etching process, an opening 3200P1 may be formed in or through the second metal layer 320, wherein the opening 3200P1 overlaps the sub-pixel electrode 210 and the protective layer 113 and passes through the bottom surface from the upper surface of the second metal layer 320. An opening 3100P1 may be formed in the first metal layer 310, wherein the opening 3100P1 overlaps the sub-pixel electrode 210 and the protective layer 113 and passes through the bottom surface from the upper surface of the first metal layer 310.

Referring to FIG. 5F, an opening having an undercut shape may be formed in the metal bank layer 300 by using the photoresist PR as a mask.

As an example, a portion of the first metal layer 310 may be further etched by using the photoresist PR as a mask, and an opening 3100P2 may be formed in the first metal layer 310, wherein the opening 3100P2 has a width greater than the width of the opening 3100P1 of the first metal layer 310 formed in the process of FIG. 5E. According to some embodiments, the opening 3100P2 of the first metal layer 310 may have a shape reducing toward the lower portion. As an example, the width of the upper portion of the opening 3100P2 of the first metal layer 310 may be greater than the width of the lower portion. In other words, the lateral surface of the first metal layer 310 facing the opening 3100P2 may include a slope surface tapered forward.

According to some embodiments, the opening OP having an undercut shape may be formed in the metal bank layer 300 through wet etching. As an example, the opening 3100P2 of the first metal layer 310 may be formed through wet etching. Because the first metal layer 310 and the second metal layer 320 include metals having different etching selectivities, a portion of the first metal layer 310 may be removed during the wet etching process, and the opening 3100P2 of the first metal layer 310 having a width greater than the width of the opening 3200P1 of the second metal layer 320 may be formed. During the etching process of forming the opening 3100P2 of the first metal layer 310, the insulating layer 115 and the protective layer 113 may be configured to protect the sub-pixel electrode 210 thereunder.

Because the opening 3100P2 of the first metal layer 310 has a large diameter while overlapping the opening 3200P1 of the second metal layer 320, the second metal layer 320 may have a first tip PT1.

A portion of the second metal layer 320 defining the opening 3200P1 of the second metal layer 320 may protrude to the opening 3200P1 from a point CP at which the lateral surface of the first metal layer 310 facing the opening 3100P2 of the first metal layer 310 meets the bottom surface of the second metal layer 320 and may form an undercut structure. A portion of the second metal layer 320 further protruding to the opening 3200P1 may correspond to the first tip PT1. The length of the first tip PT1, for example, a length "a" from the point CP to the edge (or the lateral surface) of the first tip PT1 may be 2 μm or less. According to some embodiments, the length of the first tip PT1 of the second metal layer 320 may be about 0.3 μm to about 1 μm or about 0.3 μm to about 0.7 μm.

A tapered slope angle of the lateral surface of the first metal layer 310 (e.g., a slope angle of the lateral surface of the first metal layer 310 with respect to a virtual line IML parallel to the upper surface of the substrate 100) facing the opening 3100P2 of the first metal layer 310 may be equal to or greater than about 60° and less than about 90°.

Referring to FIG. 5G, a portion of the insulating layer 115 may be removed using the photoresist PR as a mask. A portion of the insulating layer 115 may be removed by dry etching. The width of the opening 1150P1 of the insulating layer may be substantially the same as the width of the opening area of the photoresist PR and/or the width of the upper side of the opening OP of the bank layer 300 (e.g., the width of the opening 3200P1 of the second metal layer 320).

As an example, the width of the opening 1150P1 of the insulating layer 115 may be less than the width of the lower portion of the first metal layer 310. The lower portion (e.g., a point at which the lateral surface of the first metal layer 310 meets the bottom surface) of the lateral surface of the first metal layer 310 may meet the upper surface of the insulating layer 115.

Referring to FIG. 5H, a portion of the protective layer 113 may be removed using the photoresist PR as a mask. A portion of the protective layer 113 may be removed using wet etching, and the sub-pixel electrode 210 may be exposed through the opening 1130P1 of the protective layer 113. Because a portion of the protective layer 113 is removed, the width of the opening 1130P1 of the protective layer 113 may be greater than the width of the opening 1150P1 of the insulating layer 115. In other words, the edge (or the lateral surface) of the protective layer 113 defining the opening 1130P1 of the protective layer 113 may be located under the insulating layer 115.

Then, the photoresist PR may be removed using any suitable photoresist removal process.

Referring to FIG. 5I, an intermediate layer 220 and an opposite electrode 230 are formed on the structure of FIG. 5H from which the photoresist PR is removed, to overlap the sub-pixel electrode 210. A stack structure of the sub-pixel electrode 210, the intermediate layer 220, and the opposite electrode 230 correspond to the light-emitting diode ED. According to some embodiments, the intermediate layer 220 and the opposite electrode 230 may each be formed by deposition methods such as thermal deposition.

The intermediate layer 220 may include an emission layer 222 as shown in FIG. 5K. The intermediate layer 220 may include a common layer located between the sub-pixel electrode 210 and the emission layer 222 and/or between the emission layer 222 and the opposite electrode 230. Hereafter, a common layer located between the sub-pixel electrode 210 and the emission layer 222 is referred to as a first common layer 221, and a common layer located between the emission layer 222 and the opposite electrode 230 is referred to as a second common layer 223".

The emission layer 222 may include a polymer organic material or a low-molecular weight organic material emitting light having a preset color (red, green, or blue). According to some embodiments, the emission layer 222 may include an inorganic material or quantum dots.

The first common layer 221 may include a hole transport layer (HTL) and/or a hole injection layer (HIL). The second common layer 223 may include an electron transport layer (ETL) and/or an electron injection layer (EIL). The first common layer 221 and the second common layer 223 may each include an organic material.

The intermediate layer 220 may have a single stack structure including a single emission layer, or a tandem structure, which is a multi-stack structure including a plurality of emission layers. In the case where the intermediate layer 220 has a tandem structure, a charge generation layer CGL may be located between the plurality of stacks.

The opposite electrode 230 may include a conductive material having a low work function. As an example, the opposite electrode 230 may include a (semi) transparent layer including silver (Ag), magnesium (Mg), aluminum (Al), platinum (Pt), palladium (Pd), gold (Au), nickel (Ni), neodymium (Nd), and iridium (Ir), chromium (Cr), lithium (Li), calcium (Ca), or an alloy thereof. Alternatively, the opposite electrode 230 may further include a layer on the (semi) transparent layer, the layer including ITO, IZO, ZnO, or $In_2O_3$. According to some embodiments, the opposite electrode 230 may have a structure in which magnesium (Mg) and silver (Ag) are stacked.

Referring to FIG. 5I again, the intermediate layer 220 may overlap and contact the sub-pixel electrode 210 through the opening OP of the metal bank layer 300, the opening 1150P1 of the insulating layer 115, and the opening 1130P1 of the protective layer 113. The width of the emission area of the light-emitting diode ED may be substantially the same as the width of the opening 1150P1 of the insulating layer 115.

Because the intermediate layer 220 and the opposite electrode 230 are deposited without a separate mask, a deposition material for forming the intermediate layer 220 and a deposition material for forming the opposite electrode 230 may form a dummy intermediate layer 220*b* and a dummy opposite electrode 230*b* on the metal bank layer 300. The intermediate layer 220 may be separated and spaced apart from the dummy intermediate layer 220*b*, and the opposite electrode 230 may be separated and apart from the dummy opposite electrode 230*b*. The intermediate layer 220 and the dummy intermediate layer 220*b* may include the same material and/or the same number of sub-layers (e.g., a first common layer, an emission layer, and a second common layer). The opposite electrode 230 and the dummy opposite electrode 230*b* may include the same material.

The edge or outer portion (or neighboring portion) of the opposite electrode 230 may extend beyond the edge or outer portion (or neighboring portion) of the intermediate layer 220 and directly contact the lateral surface of the first metal layer 310. The first metal layer 310 may be electrically connected to the opposite electrode 230. In the present specification, the “outer portion (or neighboring portion)” of the opposite electrode 230 denotes a “portion of the opposite electrode 230 including the edge of the opposite electrode 230”.

Referring to FIG. 5J, a first inorganic encapsulation layer 510 is formed on the light-emitting diode ED. The first inorganic encapsulation layer 510 is included in an encapsulation layer 500 (see FIG. 6), and the encapsulation layer 500 may include at least one inorganic encapsulation layer and at least one organic encapsulation layer. Although FIG. 5J shows a structure in which only the first inorganic encapsulation layer 510 is located, the encapsulation layer 500 may include the first inorganic encapsulation layer 510, an organic encapsulation layer 520 (see FIG. 6) on the first inorganic encapsulation layer 510, and a second inorganic encapsulation layer 530 (see FIG. 6) on the organic encapsulation layer 520 (see FIG. 6) according to some embodiments.

The first inorganic encapsulation layer 510 and the second inorganic encapsulation layer 530 may include an inorganic material (e.g., an inorganic insulating or encapsulating material) such as, for example, at least one inorganic material from among aluminum oxide, titanium oxide, tantalum oxide, hafnium oxide, zinc oxide, silicon oxide, silicon nitride, and silicon oxynitride and be deposited using chemical vapor deposition. The first and second inorganic encapsulation layer 510 and 530 may include a single layer or a multi-layer including the above materials. The organic encapsulation layer 520 may include a polymer-based material. The polymer-based material may include an acryl-based resin, an epoxy-based resin, polyimide, and polyethylene. According to some embodiments, the organic encapsulation layer 520 may include acrylate.

The first inorganic encapsulation layer 510 having a relatively excellent step coverage may cover at least a portion of the inner surface of the opening OP of the metal bank layer 300 having an undercut structure. According to some embodiments, the first inorganic encapsulation layer 510 may be formed to continuously overlap (or cover) the upper surface and the lateral surface of the dummy opposite electrode 230*b*, the lateral surface of the dummy intermediate layer 220*b*, the lateral surface and the bottom surface of the second metal layer 320, the lateral surface of the first metal layer 310, and the upper surface of the opposite electrode 230.

The organic encapsulation layer 520 (see FIG. 6) may be located on the first inorganic encapsulation layer 510 and may fill at least a portion of the opening OP of the metal bank layer 300. The second inorganic encapsulation layer 530 (see FIG. 6) is located on the organic encapsulation layer 520.

According to some embodiments as shown in FIGS. 5A to 5J, although the metal bank layer 300 includes the first metal layer 310 and the second metal layer 320 on the first metal layer 310, the embodiments according to the present disclosure are not limited thereto. According to some embodiments, the metal bank layer 300 may include the first metal layer 310, the second metal layer 320 on the first metal layer 310, and a third metal layer under the first metal layer 310. The third metal layer may include a material which is the same as or different from a material of the first metal layer 310.

Figure 6:
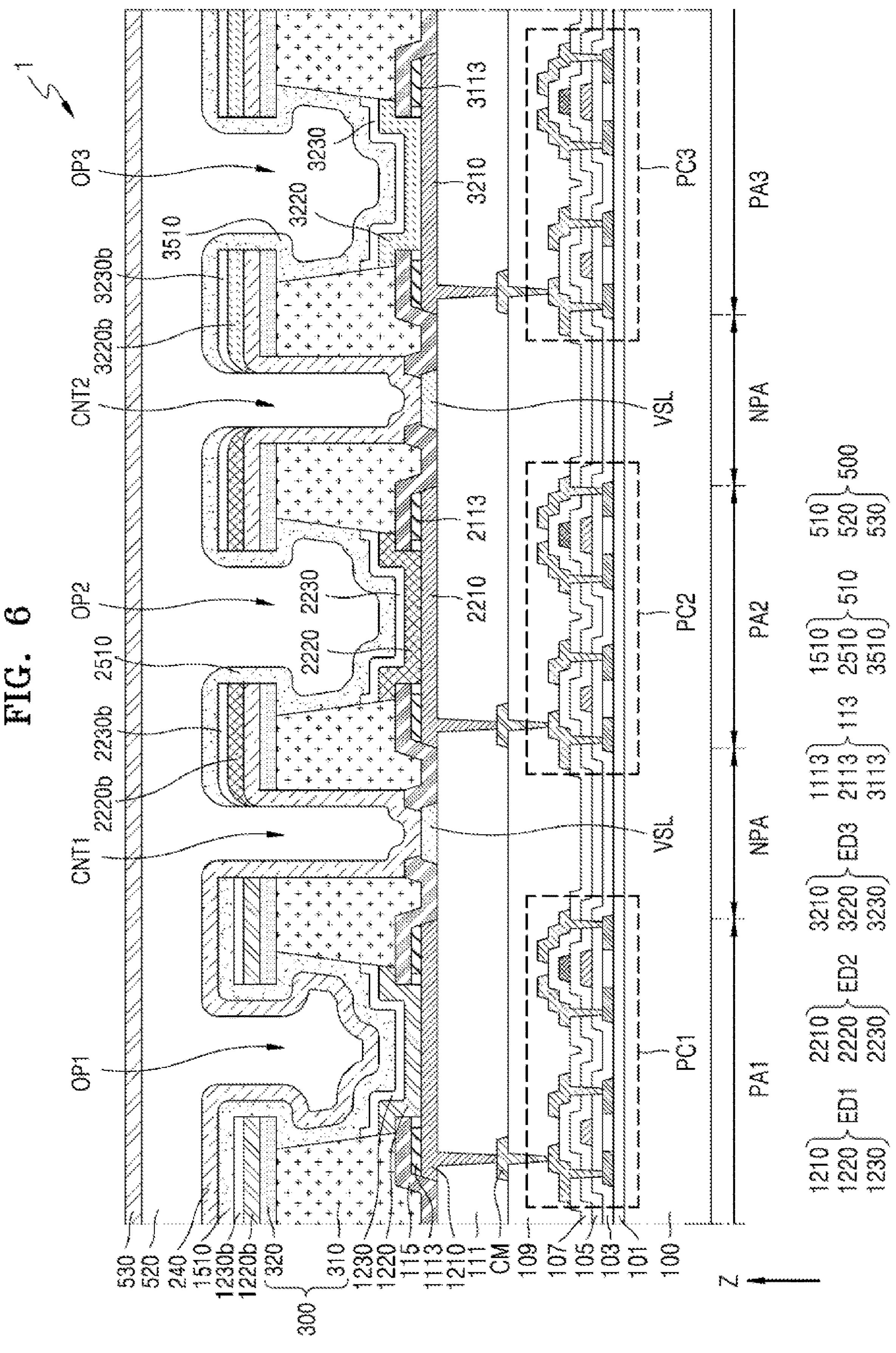
FIG. 6 is a schematic cross-sectional view of a display apparatus according to some embodiments.

FIG. 6 is a schematic cross-sectional view of the display apparatus 1 according to some embodiments.

Referring to FIG. 6, the display apparatus 1 may include first to third sub-pixel areas PA1, PA2, and PA3 and include a non-sub-pixel area NPA between the adjacent sub-pixel areas. The planar shape of the display apparatus 1 may be actually the same as a planar shape of the substrate 100. Accordingly, when the display apparatus 1 includes the first to third sub-pixel areas PA1, PA2, and PA3 and the non-sub-pixel area NPA, it may represent that the substrate 100 includes the first to third sub-pixel areas PA1, PA2, and PA3 and the non-sub-pixel area NPA.

The first to third light-emitting diodes ED1, ED2, and ED3 may be located over the substrate 100. The first to third light-emitting diodes ED1, ED2, and ED3 may be respectively arranged in the first to third sub-pixel areas PA1, PA2, and PA3.

First to third sub-pixel circuits PC1, PC2, and PC3 may be located between the substrate 100 and the first to third light-emitting diodes ED1, ED2, and ED3. The first to third sub-pixel circuits PC1, PC2, and PC3 may each include the transistor and the storage capacitor described above with reference to FIG. 3 or 4. According to some embodiments, it is shown in FIG. 6 that the first to third sub-pixel circuits PC1, PC2, and PC3 each have the same structure as the structure of the sub-pixel circuit PC (see FIG. 5A) described with reference to FIG. 5A, and a specific structure is the same as that described above.

The first to third light-emitting diodes ED1, ED2, and ED3 respectively electrically connected to the first to third sub-pixel circuits PC1, PC2, and PC3 may each have a stack structure of the sub-pixel electrode, the intermediate layer, and the opposite electrode.

As an example, the first light-emitting diode ED1 may include a first sub-pixel electrode 1210, a first intermediate layer 1220, and a first opposite electrode 1230. The first sub-pixel electrode 1210 may be electrically connected to the first sub-pixel circuit PC1. The second light-emitting diode ED2 may include a second sub-pixel electrode 2210, a second intermediate layer 2220, and a second opposite electrode 2230. The second sub-pixel electrode 2210 may be electrically connected to the second sub-pixel circuit PC2. The third light-emitting diode ED3 may include a third sub-pixel electrode 3210, a third intermediate layer 3220, and a third opposite electrode 3230. The third sub-pixel electrode 3210 may be electrically connected to the third sub-pixel circuit PC3.

The first intermediate layer 1220, the second intermediate layer 2220, and the third intermediate layer 3220 may each include the emission layer, and the first and/or second common layer as described with reference to FIG. 5K. Specific structure and material are the same as those described above. Here, the emission layer of the first intermediate layer 1220, the emission layer of the second intermediate layer 2220, and the emission layer of the third intermediate layer 3220 may be configured to emit lights of different colors.

The first sub-pixel electrode 1210, the second sub-pixel electrode 2210, and the third sub-pixel electrode 3210 may each include an inner portion and an outer portion surrounding the inner portion. In the present specification, an "outer portion (or neighboring portion)" of the sub-pixel electrode denotes a portion of the sub-pixel electrode including the edge of the sub-pixel electrode, and an "inner portion of the sub-pixel electrode" denotes another portion of the sub-pixel area surrounded by the outer portion (or neighboring portion).

The first intermediate layer 1220 may overlap and contact the inner portion of the first sub-pixel electrode 1210, and the first opposite electrode 1230 may overlap the first intermediate layer 1220. The insulating layer 115 may be located on the outer portion of the first sub-pixel electrode 1210. The insulating layer 115 may overlap the outer portion of the first sub-pixel electrode 1210 and extend on the second organic insulating layer 111 to cover the lateral surface of the first sub-pixel electrode 1210. A first protective layer 1113 may be located between the insulating layer 115 and the outer portion of the first sub-pixel electrode 1210. The insulating layer 115 and the first protective layer 1113 each are located on the outer portion of the first sub-pixel electrode 1210, and are not present on the inner portion of the first sub-pixel electrode 1210. In other words, the insulating layer 115 and the first protective layer 1113 may each include an opening overlapping the inner portion of the first sub-pixel electrode 1210.

Similarly, the second intermediate layer 2220 may overlap and contact the inner portion of the second sub-pixel electrode 2210, and the second opposite electrode 2230 may overlap the second intermediate layer 2220. The outer portion of the second sub-pixel electrode 2210 may overlap the insulating layer 115. The third intermediate layer 3220 may overlap and contact the inner portion of the third sub-pixel electrode 3210, and the third opposite electrode 3230 may overlap the third intermediate layer 3220. The outer portion of the third sub-pixel electrode 3210 may overlap the insulating layer 115. The insulating layer 115 may overlap the outer portion of each of the second sub-pixel electrode 2210 and the third sub-pixel electrode 3210 and extend on the second organic insulating layer 111 to cover the lateral surface of each of the second sub-pixel electrode 2210 and the third sub-pixel electrode 3210. A second protective layer 2113 may be located between the insulating layer 115 and the second sub-pixel electrode 2210, and a third protective layer 3113 may be located between the insulating layer 115 and the third sub-pixel electrode 3210.

The metal bank layer 300 may include first to third openings OP1, OP2, and OP3 respectively overlapping the third to third sub-pixel electrodes 1210, 2210, and 3210. The first to third openings OP1, OP2, and OP3 of the metal bank layer 300 of FIG. 6 may each have the same structure as the opening OP (see FIG. 5F) described above with reference to FIG. 5F.

As an example, the first to third openings OP1, OP2, and OP3 may each pass through the bottom surface from the upper surface of the metal bank layer 300 and have a cross-sectional structure of an undercut shape. The lateral surface of the first metal layer 310 facing a relevant opening among the first to third openings OP1, OP2, and OP3 of the metal bank layer 300 may have a forward tapered shape and have a slope angle equal to or greater than 60° and less than 90°. The second metal layer 320 of the metal bank layer 300 may include the first tip PT1 extending to a relevant opening among the first to third openings OP1, OP2, and OP3. The length of the first tip PT1 may be 2 μm or less. According to some embodiments, the length of the first tip PT1 may be about 0.3 μm to about 1 μm, or about 0.3 μm to about 0.7 μm.

In the display apparatus 1 according to some embodiments, the first to third intermediate layer 1220, 2220, and 3220 and the first to third opposite electrodes 1230, 2230, and 3230 may be deposited due to the structure of the metal bank layer 300 including the first to third openings OP1, OP2, and OP3 having the undercut structure without using a separate mask when forming the first to third intermediate layer 1220, 2220, and 3220 and the first to third opposite electrodes 1230, 2230, and 3230. Accordingly, damage to the display apparatus 1 due to the mask may be prevented or reduced.

Because a material forming the intermediate layer and a material forming the opposite electrode are deposited without using a mask, the material forming the intermediate layer and the material forming the opposite electrode may be deposited in a relevant opening among the first to third openings OP1, OP2, and OP3, and deposited on the metal bank layer 300. At least one dummy intermediate layer and at least one dummy opposite electrode layer may be located on the metal bank layer 300. The at least one dummy intermediate layer may be separated and apart from the first to third intermediate layers 1220, 2220, and 3220 respectively located in the first to third openings OP1, OP2, and OP3. The at least one dummy opposite electrode layer may be separated and apart from the first to third opposite electrodes 1230, 2230, and 3230 respectively located in the first to third openings OP1, OP2, and OP3.

According to some embodiments, the dummy intermediate layer may include a first dummy intermediate layer 1220*b* deposited together with the first intermediate layer 1220, a second dummy intermediate layer 2220*b* deposited together with the second intermediate layer 2220, and a third dummy intermediate layer 3220*b* deposited together with the third intermediate layer 3220. The dummy opposite electrode layer may include a first dummy opposite electrode layer 1230*b* deposited together with the first opposite electrode 1230, a second dummy opposite electrode layer 2230*b* deposited together with the second opposite electrode 2230, and a third dummy opposite electrode layer 3230*b* deposited together with the third opposite electrode 3230.

The first to third light-emitting diodes ED1, ED2, and ED3 may be encapsulated by the encapsulation layer 500. According to some embodiments, it is shown in FIG. 6 that the encapsulation layer 500 includes the first inorganic encapsulation layer 510, the organic encapsulation layer 520 on the first inorganic encapsulation layer 510, and the second inorganic encapsulation layer 530 on the organic encapsulation layer 520. The materials of the first inorganic encapsulation layer 510, the organic encapsulation layer 520, and the second encapsulation layer 530 are the same as the materials described above with reference to FIG. 5J.

The first inorganic encapsulation layer 510 may cover a structure and/or a layer under the first inorganic encapsulation layer 510. As an example, the first inorganic encapsulation layer having a relatively excellent step coverage may cover a structure and/or a layer inside the first to third openings OP1, OP2, and OP3. The first inorganic encapsulation layer 510 may overlap (or cover) the upper surface and lateral surface of the first to third dummy opposite electrodes 1230*b*, 2230*b*, and 3230*b*, the lateral surface of the first dummy intermediate layers 1220*b*, 2220*b*, and 3220*b*, the lateral surface and bottom surface of the first tip PT1, the lateral surface of the first metal layer 310, and the upper surface of the first to third opposite electrodes 1230, 2230, and 3230.

The first inorganic encapsulation layer 510 may include a first sub-pixel inorganic encapsulation layer 1510 covering the first sub-pixel area PA1, a second sub-pixel inorganic encapsulation layer 2510 covering the second sub-pixel area PA2, and a third sub-pixel inorganic encapsulation layer 3510 covering the third sub-pixel area PA3. That is, as shown in FIG. 6, the first inorganic encapsulation layer 510 may not be arranged in the non-sub-pixel area NPA. Through the encapsulation layer 500, a structure in which the sub-pixel areas are encapsulated for each sub-pixel area may be formed, and an effect of suppressing growth of detects such as black spots may be implemented.

A portion of the organic encapsulation layer 520 may at least partially fill each of the first to third openings OP1, OP2, and OP3. Another portion of the organic encapsulation layer 520 may at least partially fill each of a first contact hole CNT1 and a second contact hole CNT2.

A common voltage electrode VSL may be arranged to be adjacent to the first to third sub-pixel electrodes 1210, 2210, and 3210. As shown in FIG. 6, the common voltage electrode VSL may be arranged between adjacent light-emitting diodes or between adjacent sub-pixel electrodes. For example, the common voltage electrode VSL may be arranged between the first sub-pixel electrode 1210 and the second sub-pixel electrode 2210, and between the second sub-pixel electrode 2210 and the third sub-pixel electrode 3210. The common voltage electrode VSL may extend in one direction (e.g., a Y direction).

The common voltage electrode VSL may be electrically connected to the common power supply line 16 (see FIG. 2) arranged in the non-display area NDA. Accordingly, the common voltage electrode VSL may be configured to receive the common voltage ELVSS from the common power supply line 16 (see FIG. 2). The common voltage electrode VSL may be configured to transfer the common voltage ELVSS to the first to third opposite electrodes 1230, 2230, and 3230 through a connection electrode 240 described below.

The common voltage electrode VSL may be located on the same layer (e.g., the second organic insulating layer 111) as the first to third sub-pixel electrodes 1210, 2210, and 3210 and may include the same material as a material of the first to third sub-pixel electrodes 1210, 2210, and 3210. As an example, in the case where the first to third sub-pixel electrodes 1210, 2210, and 3210 have a three-layered structure of an ITO layer, an Ag layer, and an ITO layer, the common voltage electrode VSL may also have a three-layered structure of an ITO layer, an Ag layer, and an ITO layer. However, the embodiments according to the present disclosure are not limited thereto and the common voltage electrodes VSL may be located on the same layer as the connection metal CM and may include the same material as a material of the connection metal CM. In this case, the common voltage electrode VSL may be electrically connected to an electrode located on the same layer as the first to third sub-pixel electrodes 1210, 2210, and 3210 and be configured to transfer the common voltage ELVSS.

The metal bank layer 300 may include a plurality of contact holes respectively overlapping the common voltage electrodes VSL. The metal bank layer 300 may include the first contact hole CNT1 and the second contact hole CNT2, wherein the first contact hole CNT1 overlaps the common voltage electrode VSL arranged between the first sub-pixel electrode 1210 and the second sub-pixel electrode 1220, and the second contact hole CNT2 overlaps the common voltage electrode VSL arranged between the second sub-pixel electrode 2210 and the third sub-pixel electrode 3210.

The first contact hole CNT1 and the second contact hole CNT2 may pass through the bottom surface of the insulating layer 115 from the upper surface of the metal bank layer 300. That is, the first contact hole CNT1 and the second contact hole CNT2 may be formed by removing a portion of the metal bank layer 300 and a portion of the insulating layer 115 overlapping the common voltage electrode VSL. The first contact hole CNT1 and the second contact hole CNT2 may expose a portion of the upper surface of the common voltage electrode VSL to the outside. Accordingly, because the connection electrode 240 described below may be electrically connected to the common voltage electrode VSL, the common voltage ELVSS may be transferred to the opposite electrode 230.

The connection electrode 240 may be deposited to cover the first contact hole CNT1 and the second contact hole CNT2. That is, a portion of the connection electrode 240 may directly contact a portion of the exposed upper surface of the common voltage electrode VSL, and another portion of the connection electrode 240 may directly contact the lateral surface of the metal bank layer 300 facing the first contact hole CNT1 or the second contact hole CNT2. The connection electrode 240 may electrically connect the common voltage electrode VSL to the metal bank layer 300.

However, the connection electrode 240 is not deposited limited to the first contact hole CNT1 and the second contact hole CNT2 but may be deposited entirely. The connection electrode 240 may be deposited on also the first to third sub-pixel areas PA1, PA2, and PA3. According to some embodiments, the connection electrode 240 may be located on the first sub-pixel inorganic encapsulation layer 1510 in the first sub-pixel area PA1, be located between the second metal layer 320 and the second dummy intermediate layer 2220*b* in the second sub-pixel area PA2, and be located between the second metal layer 320 and the third dummy intermediate layer 3220*b* in the third sub-pixel area PA3. However, the position at which the connection electrode 240 is located in the sub-pixel areas PA1, PA2, and PA3 is not limited thereto, and may change according to a process order in which the first contact hole CNT1, the second contact hole CNT2, and the connection electrode 240 are formed.

The connection electrode 240 may include a conductive material having a low work function. The connection electrode 240 may include the same material as a material of the opposite electrode 230. As an example, the connection electrode 240 may include a (semi) transparent layer including silver (Ag), magnesium (Mg), aluminum (Al), platinum (Pt), palladium (Pd), gold (Au), nickel (Ni), neodymium (Nd), and iridium (Ir), chromium (Cr), lithium (Li), calcium (Ca), or an alloy thereof. Alternatively, the connection electrode 240 may further include a layer on the (semi) transparent layer, the layer including ITO, IZO, ZnO, or $In_2O_3$. According to some embodiments, the connection electrode 240 may have a structure in which magnesium (Mg) and silver (Ag) are stacked.

The first to third opposite electrodes 1230, 2230, and 3230 may be electrically connected to the common voltage electrode VSL through the connection electrode 240. That is, the first to third opposite electrodes 1230, 2230, and 3230 may each be electrically connected to the common voltage electrode VSL through the connection electrode 240 and the metal bank layer 300. For example, the outer portion of the first opposite electrode 1230 may be electrically connected to (e.g., may directly contact) the lateral surface (e.g., the lateral surface of the first metal layer 310) of the metal bank layer 300 facing the first opening OP1. The connection electrode 240 may be electrically connected to (may directly contact) the lateral surface of the metal bank layer 300 facing the first contact hole CNT1. That is, two opposite sides of the metal bank layer 300 may respectively directly contact the connection electrode 240 and the first opposite electrode 1230. Accordingly, because the connection electrode 240 may be electrically connected to the first opposite electrode 1230, and the connection electrode 240 may be connected to the common voltage electrode VSL through the first contact hole CNT1, the first opposite electrode 1230 may be electrically connected to the common voltage electrode VSL.

Accordingly, although the first opposite electrode 1230 located in the first opening OP1 of the metal bank layer 300, the second opposite electrode 2230 located in the second opening OP2 of the metal bank layer 300, and the third opposite electrode 3230 located in the third opening OP3 of the metal bank layer 300 are spatially separated and apart from each other, the first opposite electrode 1230, the second opposite electrode 2230, and the third opposite electrode 3230 may be electrically connected to each other and may have the same voltage level. That is, the first opposite electrode 1230, the second opposite electrode 2230, and the third opposite electrode 3230 may each have the same voltage level as a voltage (e.g., a common voltage) provided by the common voltage electrode VSL.

As a result, in the display apparatus according to some embodiments, because the first to third opposite electrodes 1230, 2230, and 3230 each is connected to the common voltage electrode VSL by the connection electrode 240 and the metal bank layer 300 and may be configured to receive the common voltage ELVSS, a voltage drop of the opposite electrode 230 may be effectively prevented or reduced.

Figure 7A:
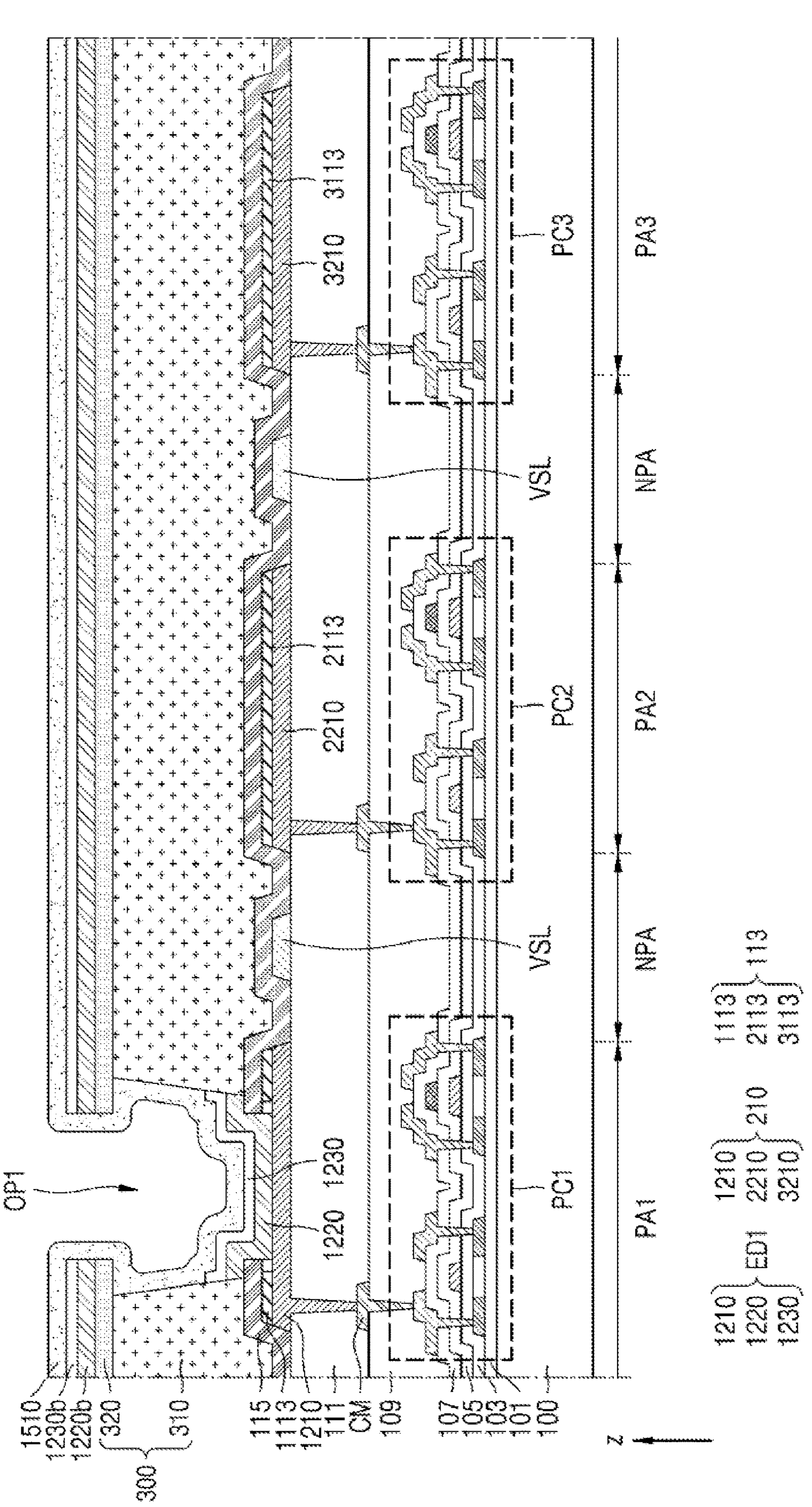
FIGS. 7A to 7O are cross-sectional views showing a process of manufacturing a display apparatus, according to some embodiments.

FIGS. 7A to 7O are cross-sectional views showing a process of manufacturing a display apparatus according to some embodiments.

Referring to FIG. 7A, the first to third sub-pixel circuits PC1, PC2, and PC3, the first organic insulating layer 109, the second organic insulating layer 111, and the connection metal CM may be formed on the substrate 100. According to some embodiments, as shown in FIG. 7A that the first to third sub-pixel circuits PC1, PC2, and PC3 have the same structure as a structure of the sub-pixel circuit PC (see FIG. 5A) described with reference to FIG. 5A.

The first to third sub-pixel electrodes 1210, 2210, and 3210 may be formed on the second organic insulating layer 111, and the common voltage electrode VSL may be formed. The first to third sub-pixel electrodes 1210, 2210, and 3210 may be respectively arranged in the first to third sub-pixel areas PA1, PA2, and PA3 and be apart from each other. The common voltage electrodes VSL may be arranged to be adjacent to one of the first to third sub-pixel electrodes 1210, 2210, and 3210. The first to third sub-pixel electrodes 1210, 2210, and 3210 and the common voltage electrode VSL may be simultaneously (or concurrently) formed during the same process. The first to third sub-pixel electrodes 1210, 2210, and 3210 and the common voltage electrode VSL may include the same material.

The first to third sub-pixel electrodes 1210, 2210, and 3210 and the common voltage electrode VSL may include a reflective layer including Ag, Mg, Al, Pt, Pd, Au, Ni, Nd, Ir, Cr, or a compound thereof, and a transparent conductive layer including ITO, IZO, ZnO, or $In_2O_3$. According to some embodiments, the first to third sub-pixel electrodes 1210, 2210, and 3210 and the common voltage electrode VSL may have a structure in which an ITO layer, an Ag layer, and an ITO layer are sequentially stacked. The first to third protective layers 1113, 2113, and 3113 may be formed to respectively overlap the first to third sub-pixel electrodes 1210, 2210, and 3210. The first to third protective layers 1113, 2113, and 3113 may include a conductive oxide such as ITO, IZO, IGZO, ITZO, ZnO, AZO, GZO, ZTO, GTO, and FTO. The first to third protective layers 1113, 2113, and 3113 and the first to third sub-pixel electrodes 1210, 2210, and 3210 may be patterned together during the same process.

The metal bank layer including the first metal layer 310 and the second metal layer 320 may be formed on the first to third protective layers 1113, 2113, and 3113. Before the metal bank layer 300 is formed, the insulating layer 115 may be formed.

Material layers corresponding to the metal bank layer 300, for example, the first metal layer 310 and the second metal layer 320 on the first metal layer 310 may be formed on the insulating layer 115. The characteristics such as the material and the thickness of the first metal layer 310 and the second metal layer 320 are the same as those described above with reference to FIG. 5C. As an example, the thickness of the first metal layer 310 may be greater than the second metal layer 320.

The first opening OP1 may be formed in the metal bank layer 300 in the first sub-pixel area PA1. The structure and the forming process of the first opening OP1 of the metal bank layer 300 are the same as those described above with reference to FIGS. 5D to 5H. That is, a portion of the second metal layer 320 and a portion of the first metal layer 310 may be sequentially removed using the photoresist PR as a mask, and an opening having an undercut shape may be formed. Openings may be also formed in the insulating layer 115 and the protective layer 113 in the first sub-pixel area PA1 to overlap the first opening OP1 of the metal bank layer 300. A portion of the upper surface of the first sub-pixel electrode 1210 may be exposed through the first opening OP1 of the metal bank layer 300, the opening of the insulating layer 115, and the opening of the protective layer 113.

Then, the first intermediate layer 1220 and the first opposite electrode 1230 may be formed to overlap the first sub-pixel electrode 1210. The first intermediate layer 1220 and the first opposite electrode 1230 may fill the first opening OP1 of the metal bank layer 300, the opening of the insulating layer 115, and the opening of the protective layer 113. That is, the first intermediate layer 1220 may overlap and contact the first sub-pixel electrode 1210 through the first opening OP1 of the metal bank layer 300, the opening of the insulating layer 115, and the opening of the protective layer 113. Because the first intermediate layer 1220 and the first opposite electrode 1230 may be deposited on the entire surface of the display panel, the first dummy intermediate layer 1220*b* and the first dummy opposite electrode 1230*b* may be located on the metal bank layer 300. The first intermediate layer 1220 and the first opposite electrode 1230 may each be formed by deposition methods such as thermal deposition.

Next, the first sub-pixel inorganic encapsulation layer 1510 may be formed to cover the first light-emitting diode ED1. The first sub-pixel inorganic encapsulation layer 1510 having a relatively excellent step coverage may cover at least a portion of the inner surface of the first opening OP1 of the first sub-pixel area PA1. In addition, the first sub-pixel inorganic encapsulation layer 1510 may be continuously formed to cover the upper surface of the first dummy opposite electrode 1230*b*.

Figure 7B:
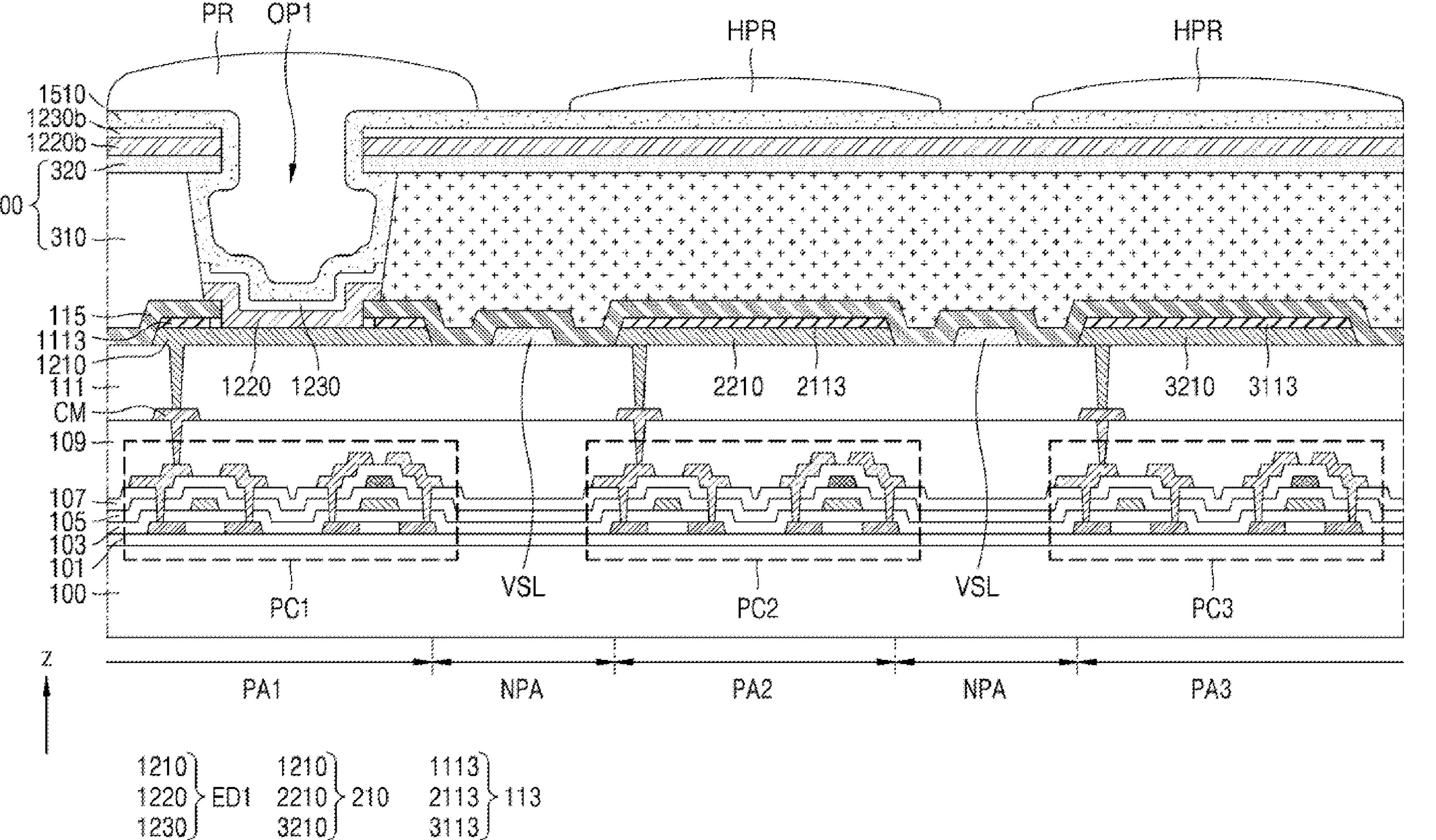

Referring to FIG. 7B, the photoresist PR and a half-tone photoresist HPR may be formed on the first sub-pixel inorganic encapsulation layer 1510. The photoresist PR may be formed to overlap the first sub-pixel area PA1, and the half-tone photoresist HPR may be formed to overlap each of the second sub-pixel area PA2 and the third sub-pixel area PA3. The photoresist PR and the half-tone photoresist HPR may not be formed in the non-sub-pixel area NPA. Because the photoresist PR is formed to overlap the first sub-pixel area PA1, the photoresist PR may be formed to fill the first opening OP1 formed in the first sub-pixel area PA1.

The photoresist PR may be formed by forming a photosensitive material layer on the first sub-pixel inorganic encapsulation layer 1510 and then exposing and developing the photosensitive material layer using a full-tone mask. Likewise, the half-tone photoresist HPR may be formed by forming a photosensitive material layer on the first sub-pixel inorganic encapsulation layer 1510 and then exposing and developing the photosensitive material layer using a half-tone mask. Accordingly, the thickness of the photoresist PR formed using a full-tone mask may be greater than the thickness of the half-tone photoresist HPR formed using a half-tone mask.

Figure 7C:
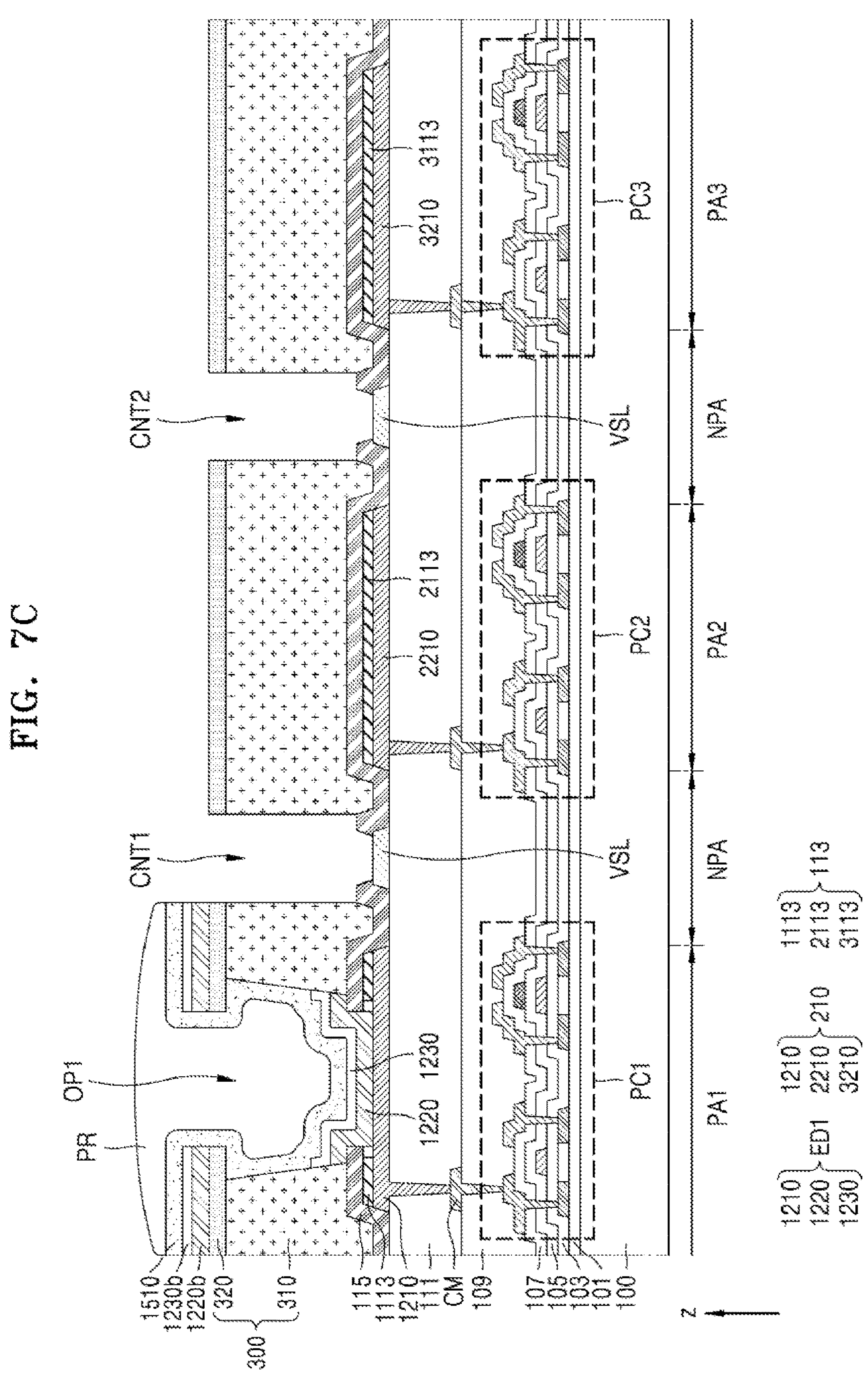

Referring to FIG. 7C, the first contact hole CNT1 and the second contact hole CNT2 may be formed by removing a portion of the structure located in the non-sub-pixel area NPA using the photoresist PR and the half-tone photoresist HPR as masks. That is, in the non-sub-pixel area NPA, which is a region in which the photoresist PR and the half-tone photoresist HPR are not arranged, a portion of the structure overlapping the common voltage electrode VSL may be removed to expose the common voltage electrode VSL. For example, a portion of the insulating layer 115, a portion of the first metal layer 310, a portion of the second metal layer 320, a portion of the first dummy intermediate layer 1220*b*, a portion of the first dummy opposite electrode 1230*b*, and a portion of the first sub-pixel inorganic encapsulation layer 1510 each overlapping the common voltage electrode VSL may be removed to form the first contact hole CNT1 and the second contact hole CNT2. A process of forming the first contact hole CNT1 and the second contact hole CNT2 may be performed through a dry etching process.

Simultaneously (or concurrently) with the etching process of forming the first contact hole CNT1 and the second contact hole CNT2, a portion of the structure located in the second sub-pixel area PA2 and the third sub-pixel area PA3 may be removed. That is, the etching process may be performed on not only the region overlapping the common voltage electrode VSL but also the region in which the half-tone photoresist HPR is arranged. For example, a portion of the first dummy intermediate layer 1220*b*, a portion of the dummy opposite electrode 1230*b*, and a portion of the first sub-pixel inorganic encapsulation layer 1510 located in the second sub-pixel area PA2 and the third sub-pixel area PA3 may be removed. That is, the insulating layer 115 and the metal bank layer 300 may remain on the second sub-pixel electrode 2210 and the third sub-pixel electrode 3210. This is because the half-tone photoresist HPR arranged in the second sub-pixel area PA2 and the third sub-pixel area PA3 is formed using a half-tone mask and the thickness of the half-tone photoresist HPR is less than the thickness of the photoresist PR arranged in the first sub-pixel area PA1. While the etching process is performed, the half-tone photoresist HPR arranged in the second sub-pixel area PA2 and the third sub-pixel area PA3 is etched and removed, and the first dummy intermediate layer 1220*b*, the first dummy opposite electrode 1230*b*, and the first sub-pixel inorganic encapsulation layer 1510, which are portions of the structure located under the half-tone photoresist HPR, may be removed.

Though the etching may be performed in the first sub-pixel area PA1, because the photoresist PR is formed using a full-tone mask and has a large thickness, a portion of the photoresist PR is etched and remaining photoresist PR and the lower structure of the photoresist PR may not be etched.

As described above, because the half-tone photoresist HPR using a half-tone mask is arranged in the second sub-pixel area PA2 and the third sub-pixel area PA3, the first contact hole CNT1 and the second contact hole CNT2 exposing the common voltage electrode VSL may be formed without an additional mask. Because the additional mask is not required, the common voltage electrode VSL may be electrically connected to the opposite electrode 230 and thus a voltage drop of the opposite electrode 230 may be relatively efficiently prevented or reduced, and effects of reducing manufacturing costs and a process time may be simultaneously (or concurrently) implemented.

Then, the photoresist PR remaining in the first sub-pixel area PA1 is removed through an ashing process.

Figure 7D:
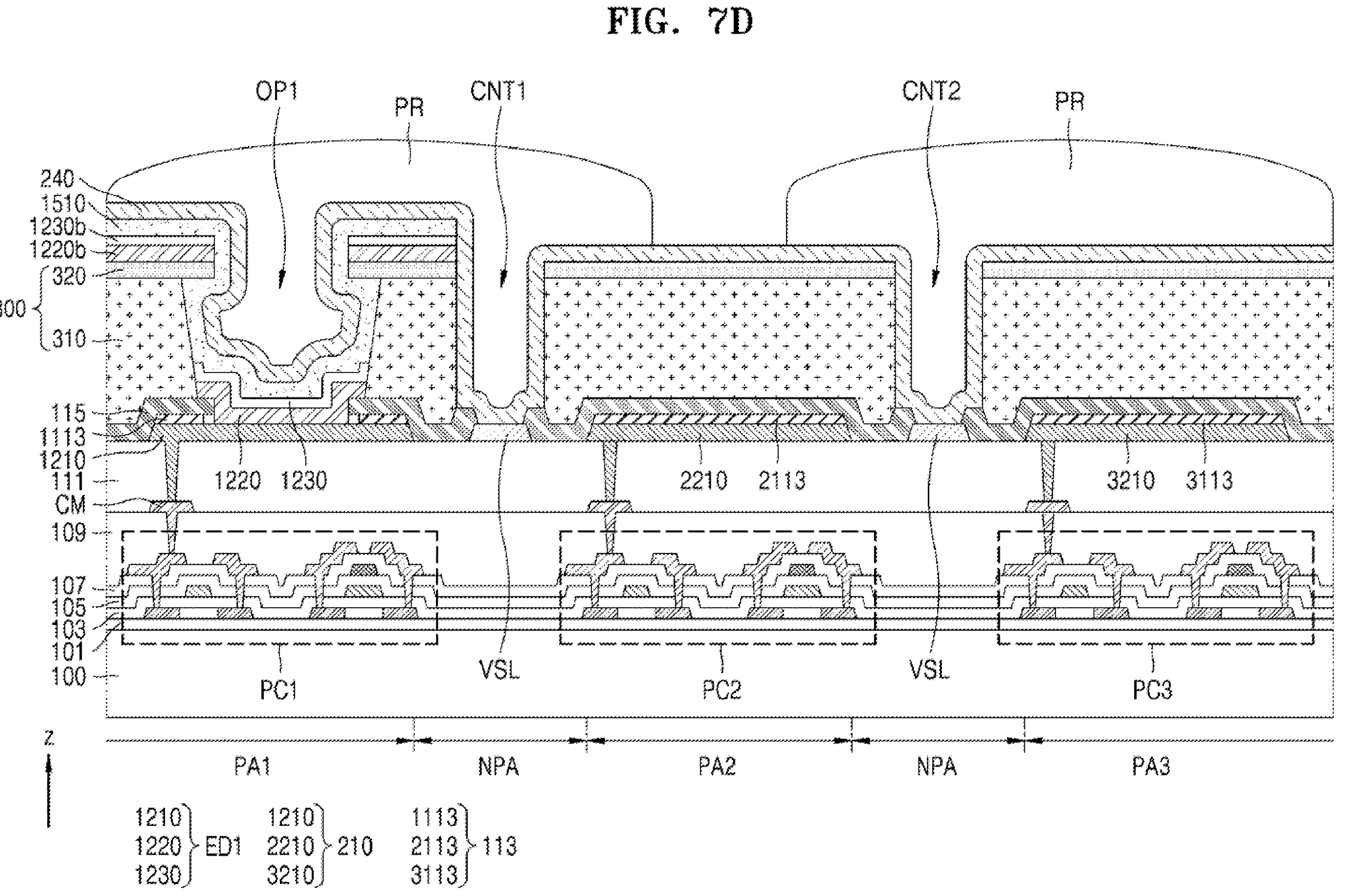

Next, referring to FIG. 7D, the connection electrode 240 may be formed on the front surface of the display panel formed from the first contact hole CNT1 to the second contact hole CNT2. In the first sub-pixel area PA1, the connection electrode 240 may be located on the first sub-pixel inorganic encapsulation layer 1510 and may extend to cover the inner surface of the first opening OP1. In the second sub-pixel area PA2 and the third sub-pixel area PA3, the connection electrode 240 may be located on the metal bank layer 300.

The connection electrode 240 may extend to cover the inner surface of the first contact hole CNT1 and the second contact hole CNT2. For example, the connection electrode 240 may extend from the lateral surface of the metal bank layer 300 arranged in the first sub-pixel area PA1 and facing the first contact hole CNT1 to the lateral surface of the metal bank layer 300 arranged in the second sub-pixel area PA2 and facing the first contact hole CNT1. Likewise, the connection electrode 240 may extend from the lateral surface of the metal bank layer 300 arranged in the second sub-pixel area PA2 and facing the second contact hole CNT2 to the lateral surface of the metal bank layer 300 arranged in the third sub-pixel area PA3 and facing the second contact hole CNT2. In addition, because the first contact hole CNT1 and the second contact hole CNT2 expose a portion of the upper surface of the common voltage electrode VSL, a portion of the lower surface of the connection electrode 240 may directly contact the common voltage electrode VSL.

As described above, the connection electrode 240 may include a conductive material having a small work function.

The connection electrode 240 may include the same material as a material of the opposite electrode 230. As an example, the connection electrode 240 may include a (semi) transparent layer including silver (Ag), magnesium (Mg), aluminum (Al), platinum (Pt), palladium (Pd), gold (Au), nickel (Ni), neodymium (Nd), and iridium (Ir), chromium (Cr), lithium (Li), calcium (Ca), or an alloy thereof. According to some embodiments, the connection electrode 240 may have a structure in which magnesium (Mg) and silver (Ag) are stacked.

Then, to form the second opening OP2 in the second sub-pixel area PA2, the photoresist PR may be formed in the rest of the region except for the portion overlapping the second sub-pixel electrode 2210.

Figure 7E:
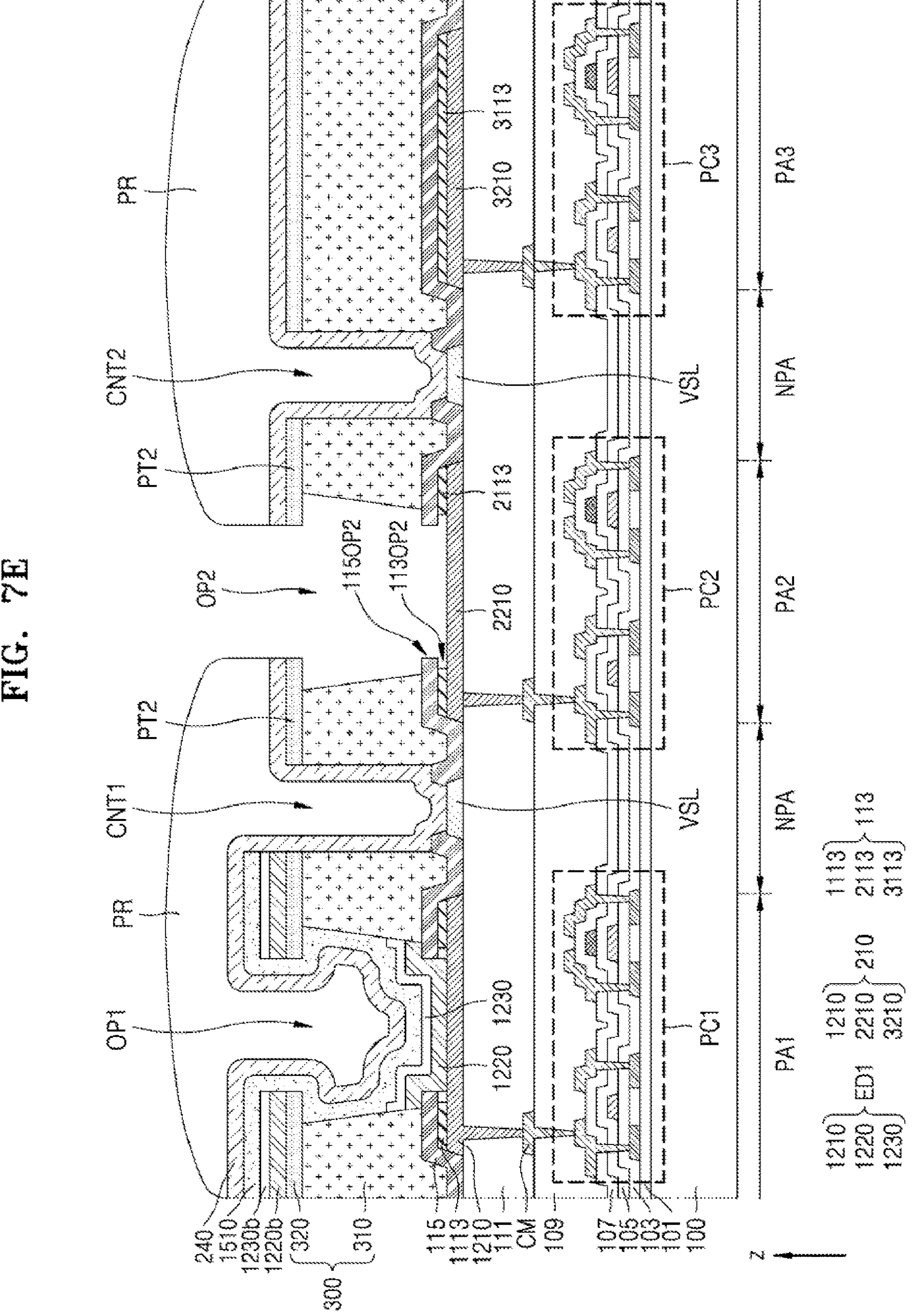

Next, referring to FIG. 7E, the second opening OP2 may be formed in the metal bank layer 300 in the second sub-pixel area PA2. The structure and the forming process of the second opening OP2 of the metal bank layer 300 are the same as those described above with reference to FIGS. 5D to 5H. That is, a portion of the second metal layer 320 and a portion of the first metal layer 310 may be sequentially removed using the photoresist PR as a mask, and an opening having an undercut shape may be formed. In addition, the opening 1150P2 of the insulating layer 115 and the opening 1130P2 of the protective layer 113 may be formed to overlap the second opening OP2 of the metal bank layer 300 in the second sub-pixel area PA2. A portion of the upper surface of the second sub-pixel electrode 2210 may be exposed through the second opening OP2 of the metal bank layer 300, the opening 1150P2 of the insulating layer 115, and the opening 1130P2 of the protective layer 113.

Next, referring to FIG. 7F, the second intermediate layer 2220 and the second opposite electrode 2230 may be formed to overlap the second sub-pixel electrode 2210. The second intermediate layer 2220 and the second opposite electrode 2230 may fill the second opening OP2 of the metal bank layer 300, the opening of the insulating layer 115, and the opening of the protective layer 113. That is, the second intermediate layer 2220 may overlap and contact the second sub-pixel electrode 2210 through the second opening OP2 of the metal bank layer 300, the opening of the insulating layer 115, and the opening of the protective layer 113. However, because the second intermediate layer 2220 and the second opposite electrode 2230 may be deposited on the front surface of the display panel, the second dummy intermediate layer 2220*b* and the second dummy opposite electrode 2230*b* may be arranged in also the first sub-pixel area PA1, the third sub-pixel area PA3, and the non-sub-pixel area NPA. A portion of the second dummy intermediate layer 2220*b* and a portion of the second dummy opposite electrode 2230*b* may be located in also the inner surface of the first contact hole CNT1 and the inner surface of the second contact hole CNT2. The second intermediate layer 2220 and the second opposite electrode 2230 may each be formed by deposition methods such as thermal deposition.

Next, the second sub-pixel inorganic encapsulation layer 2510 may be formed to cover the second light-emitting diode ED2. The second sub-pixel inorganic encapsulation layer 2510 having a relatively excellent step coverage may cover at least a portion of the inner surface of the second opening OP2 of the second sub-pixel area PA2. In addition, the second sub-pixel inorganic encapsulation layer 2510 may be continuously formed to cover the upper surface of the second dummy opposite electrode 2230*b*.

Figure 7G:
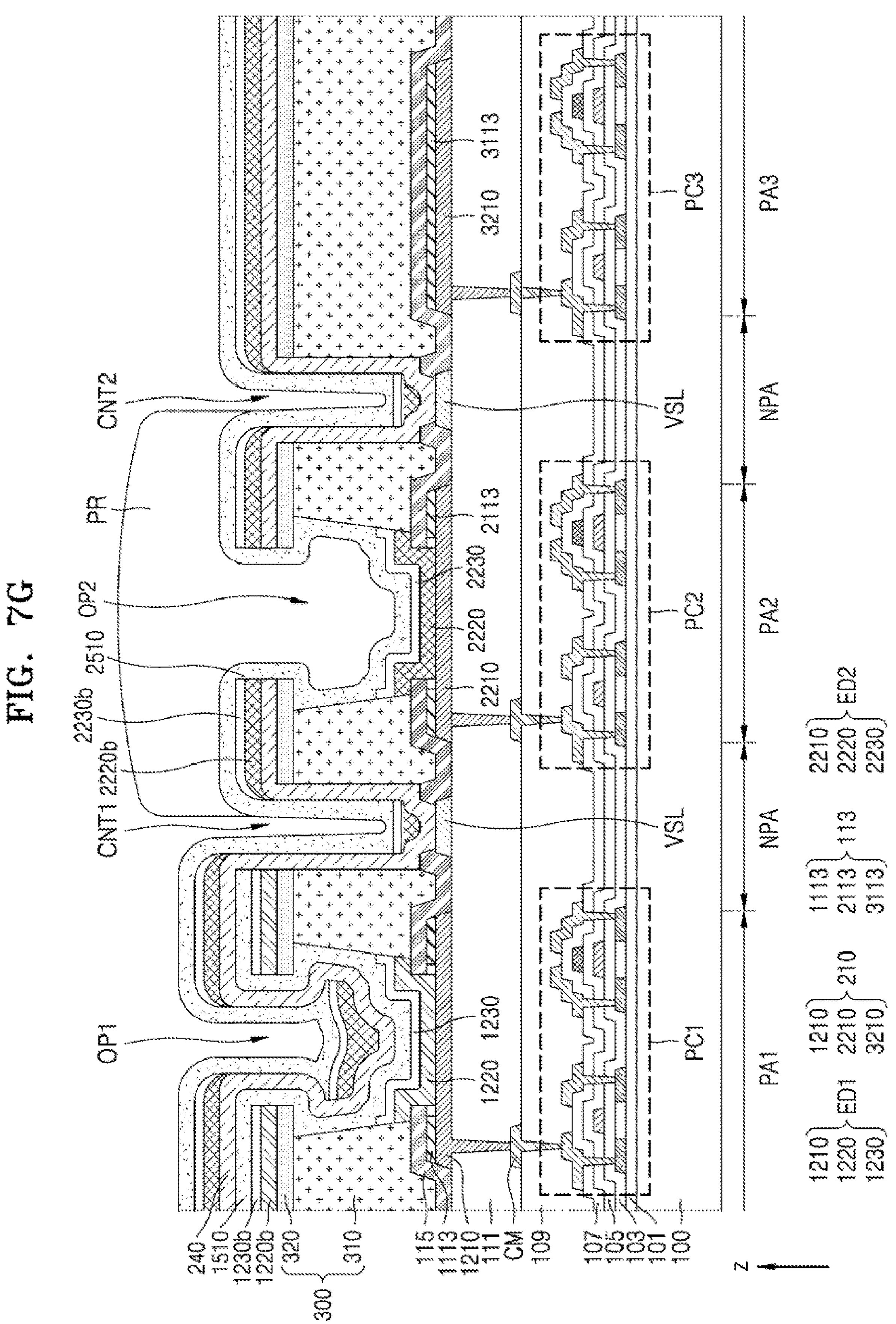

Next, referring to FIG. 7G, the photoresist PR may be formed on the second sub-pixel inorganic encapsulation layer 2510. However, the photoresist PR may be formed in only the second sub-pixel area PA2 to overlap the second sub-pixel electrode 2210. Because the photoresist PR is formed to overlap the second sub-pixel area PA2, the photoresist PR may be formed to fill the second opening OP2 formed in the second sub-pixel area PA2. The photoresist PR may be formed by forming a photosensitive material layer on the second sub-pixel inorganic encapsulation layer 2510 and then exposing and developing the photosensitive material layer using a full-tone mask.

Figure 7H:
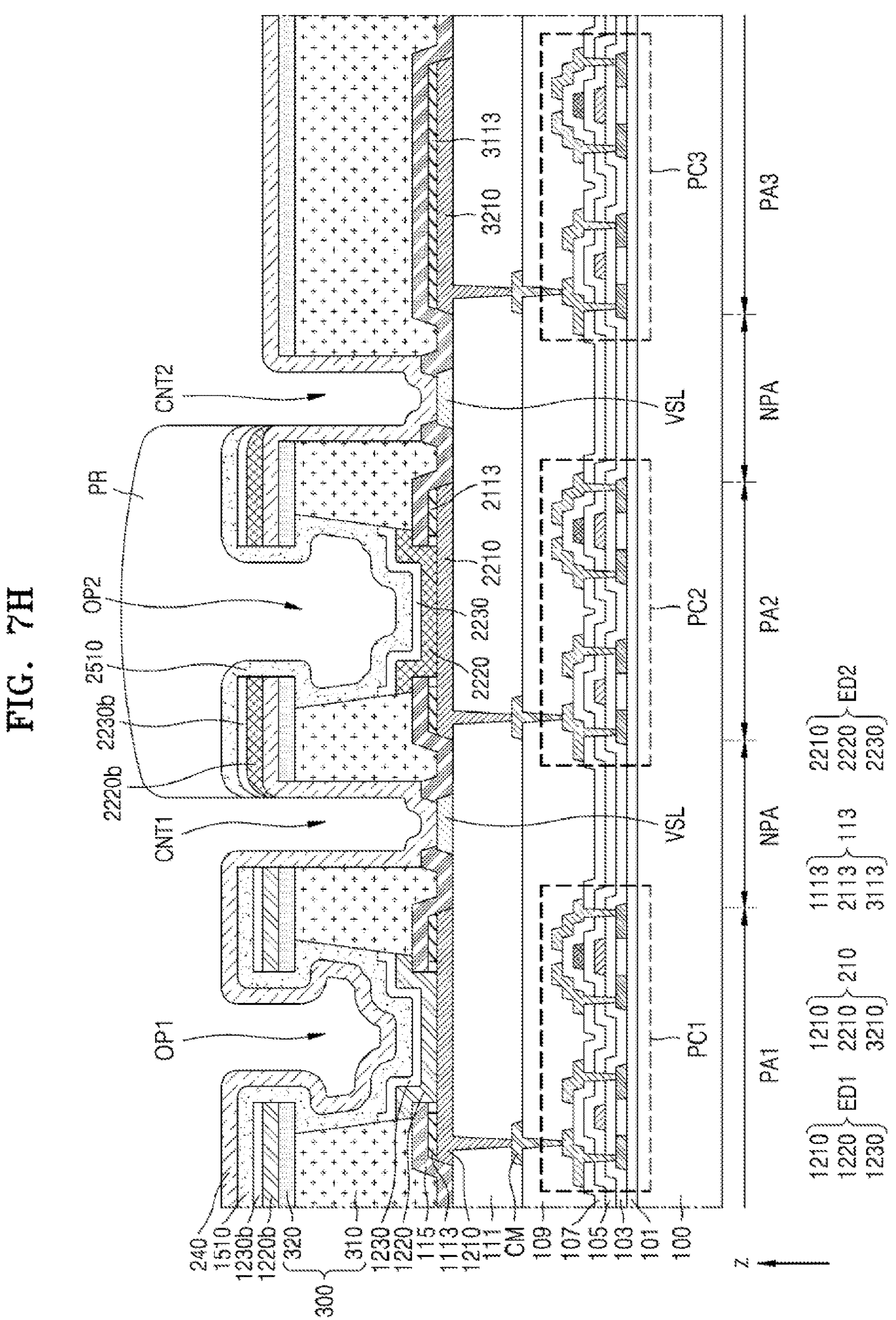

Next, referring to FIG. 7H, a portion of the structure located in a region except for the second sub-pixel area PA2 may be removed using the photoresist PR as a mask. For example, a portion of the second dummy intermediate layer 2220*b*, a portion of the second dummy opposite electrode 2230*b*, and a portion of the second sub-pixel inorganic encapsulation layer 2510 each arranged in the first sub-pixel area PA1, the third sub-pixel area PA3, and the non-sub-pixel area NPA except for the second sub-pixel area PA2, may be removed. In addition, the second intermediate layer 2220, the second dummy intermediate layer 2220*b*, the second opposite electrode 2230, the second dummy opposite electrode 2230*b*, and the second sub-pixel inorganic encapsulation layer 2510 may be arranged in only the second sub-pixel area PA2.

Figure 7I:
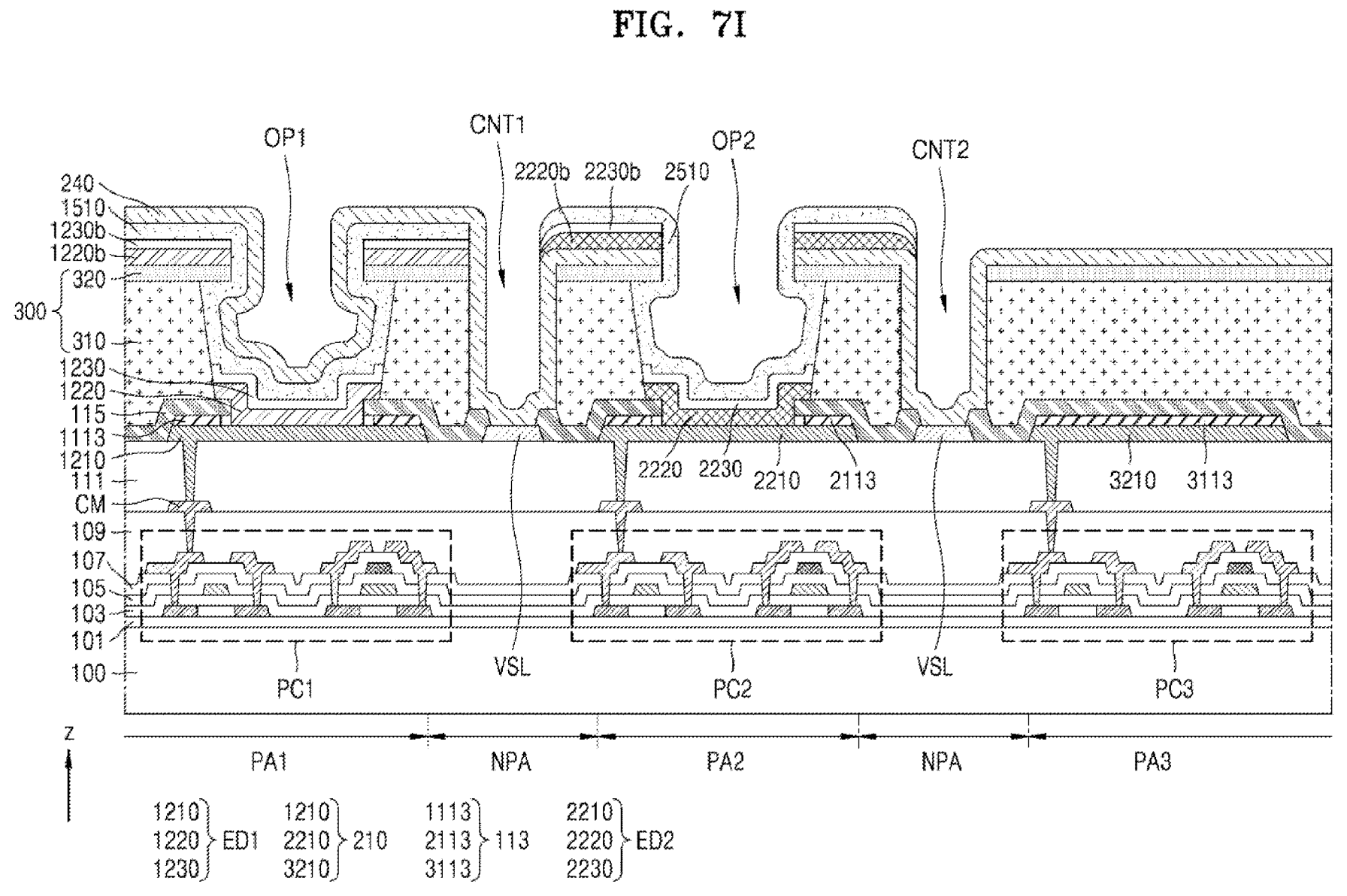

Referring to FIG. 7I, the photoresist PR remaining in the second sub-pixel area PA2 may be removed through an ashing process.

Figure 7J:
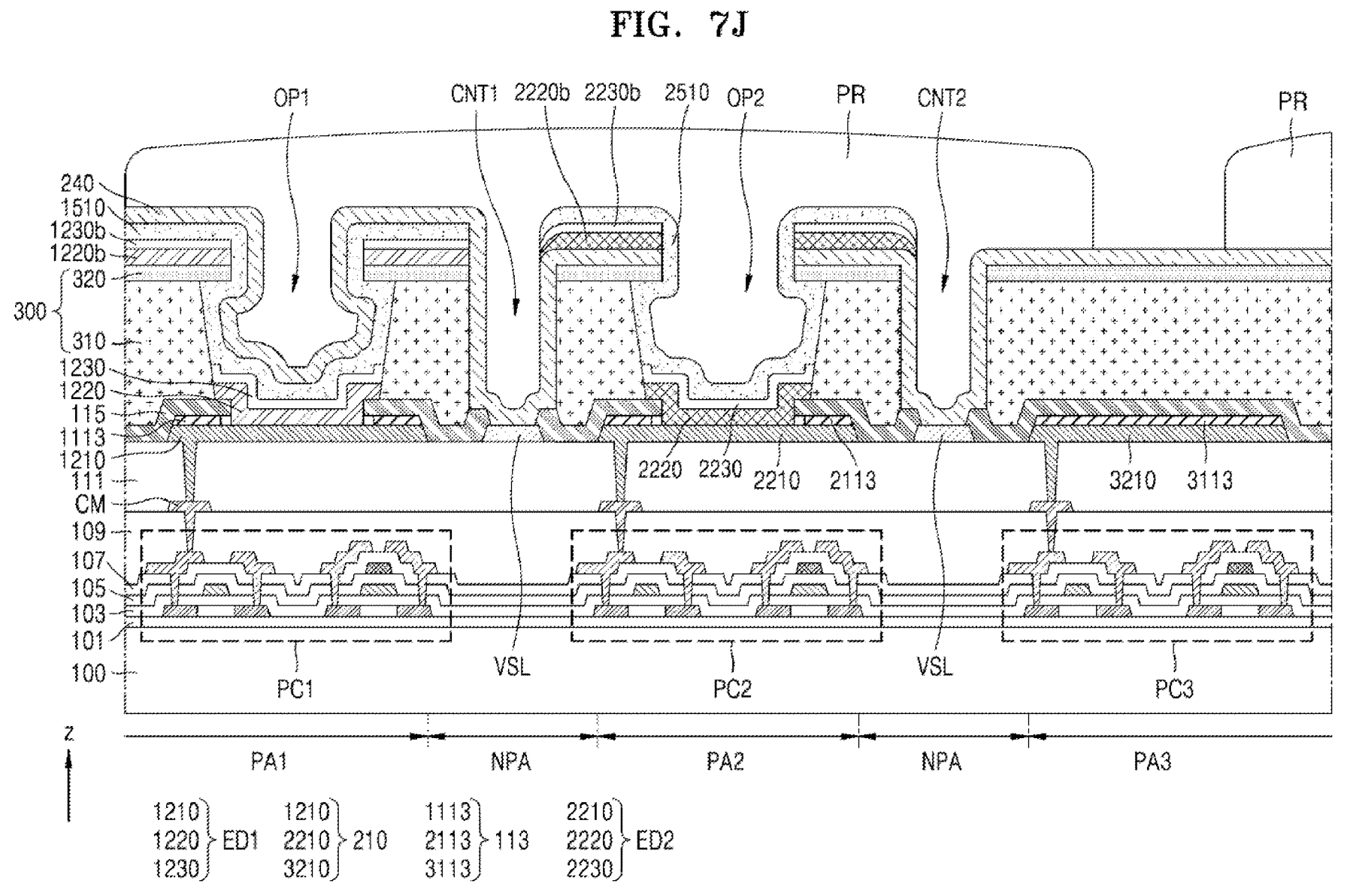

Referring to FIG. 7J, to form the third opening OP3 in the third sub-pixel area PA3, the photoresist PR may be formed in the rest of the region except for the portion overlapping the third sub-pixel electrode 3210.

Figure 7K:
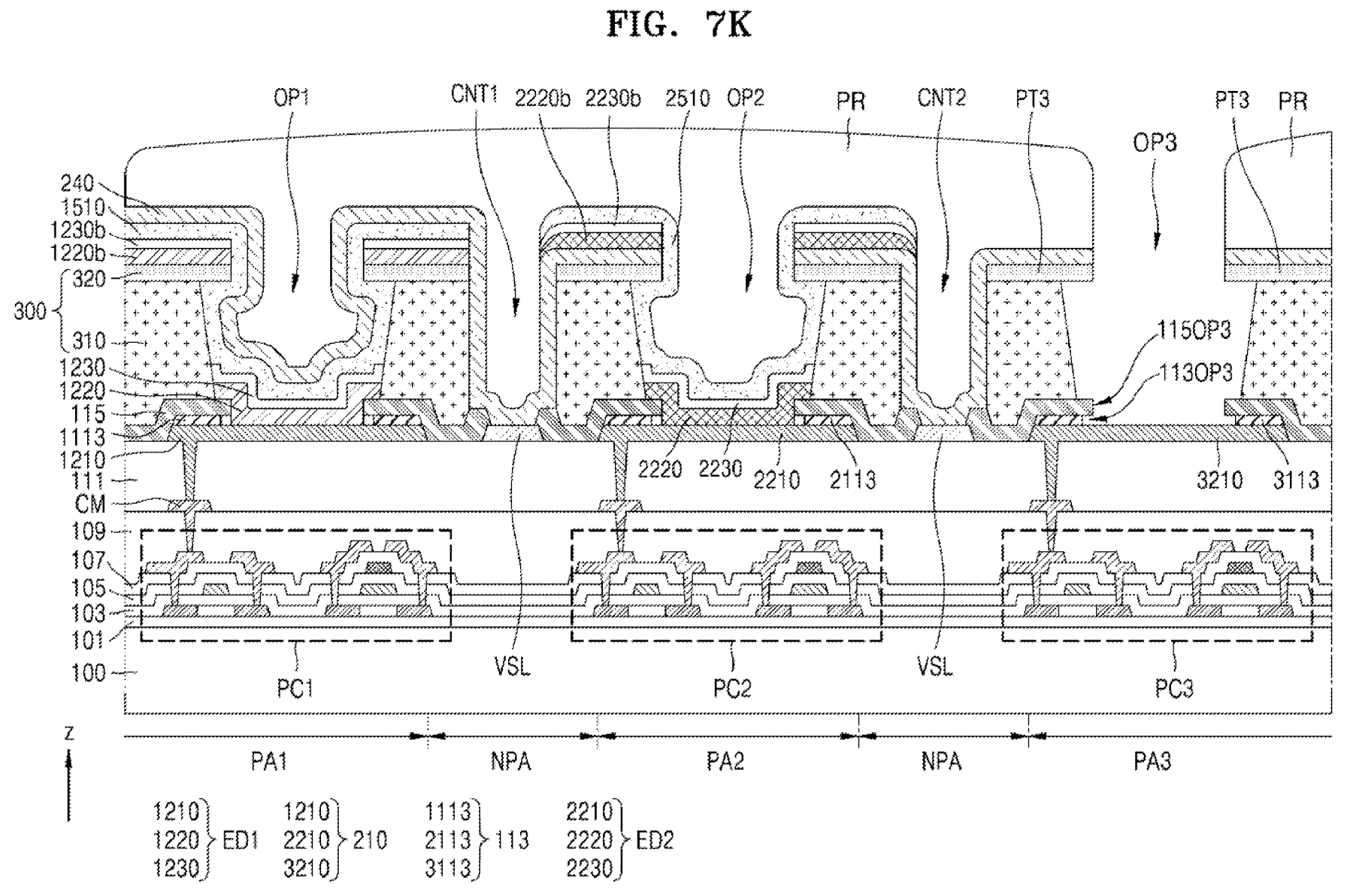
Figure 7L:
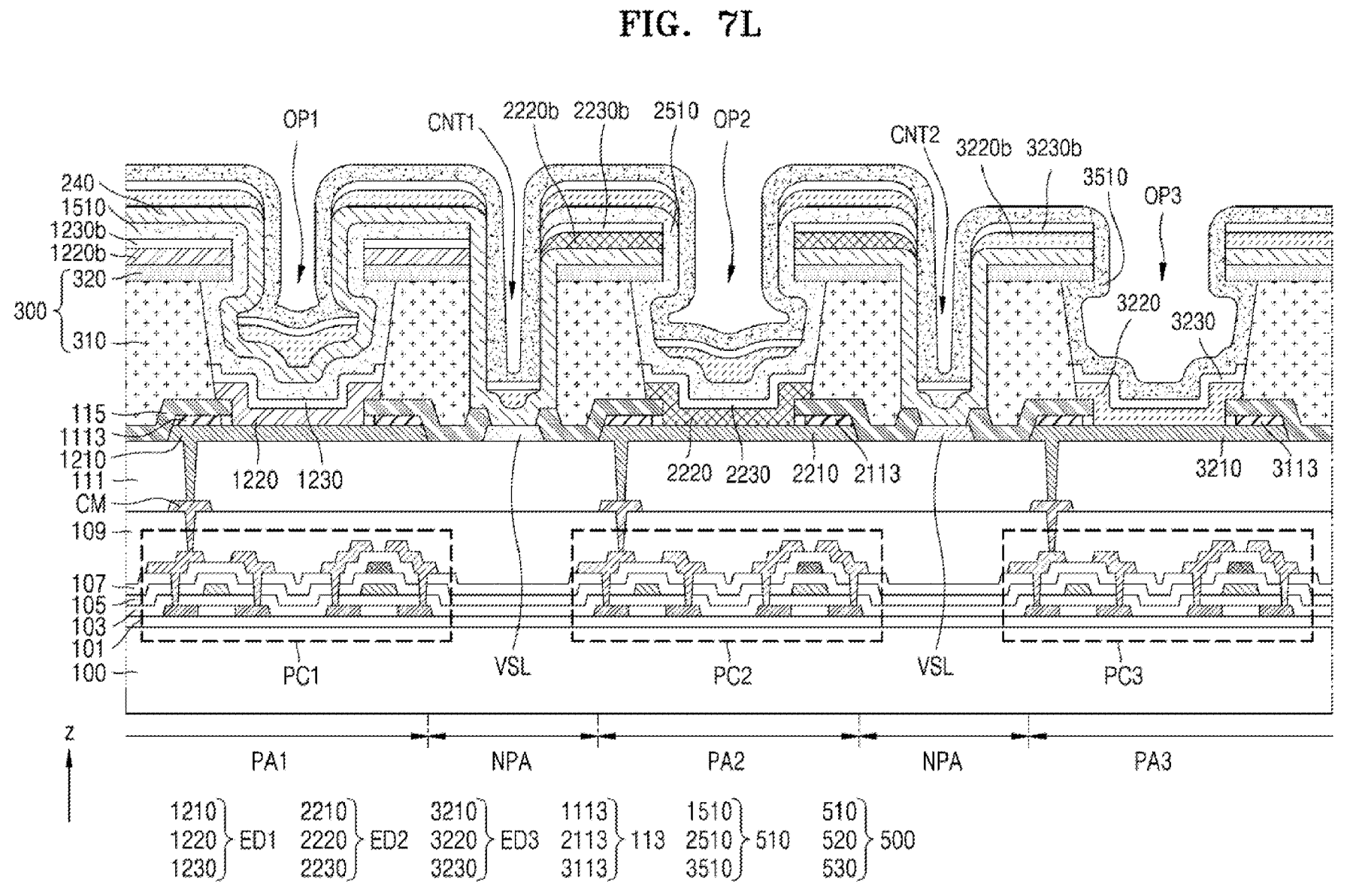

Referring to FIG. 7K, the third opening OP3 may be formed in the metal bank layer 300 in the third sub-pixel area PA3. The structure and the forming process of the third opening OP3 of the metal bank layer 300 are the same as those described above with reference to FIGS. 5D to 5H. That is, a portion of the second metal layer 320 and a portion of the first metal layer 310 may be sequentially removed using the photoresist PR as a mask, and an opening having an undercut shape may be formed. In addition, the opening 1150P3 of the insulating layer 115 and the opening 1130P3 of the protective layer 113 may be formed to overlap the third opening OP3 of the metal bank layer 300 in the third sub-pixel area PA3. A portion of the upper surface of the third sub-pixel electrode 3210 may be exposed through the third opening OP3 of the metal bank layer 300, the opening 1150P3 of the insulating layer 115, and the opening 1130P3 of the protective layer 113.

Next, referring to FIG. 7I, the third intermediate layer 3220 and the third opposite electrode 3230 may be formed to overlap the third sub-pixel electrode 3210. The third intermediate layer 3220 and the third opposite electrode 3230 may fill the third opening OP3 of the metal bank layer 300, the opening of the insulating layer 115, and the opening of the protective layer 113. That is, the third intermediate layer 3220 may overlap and contact the third sub-pixel electrode 3210 through the third opening OP3 of the metal bank layer 300, the opening of the insulating layer 115, and the opening of the protective layer 113. However, because the third intermediate layer 3220 and the third opposite electrode 3230 may be deposited on the front surface of the display panel, the third dummy intermediate layer 3220*b* and the third dummy opposite electrode 3230*b* may be arranged in also the first sub-pixel area PA1, the second sub-pixel area PA2, and the non-sub-pixel area NPA. A portion of the third dummy intermediate layer 3220*b* and a portion of the third dummy opposite electrode 3230*b* may be located in also the inner surface of the first contact hole CNT1, the inner surface of the second opening OP2, the inner surface of the second contact hole CNT2. The third intermediate layer 3220 and the third opposite electrode 3230 may each be formed by deposition methods such as thermal deposition.

Next, the third sub-pixel inorganic encapsulation layer 3510 may be formed to cover the third light-emitting diode ED3. The third sub-pixel inorganic encapsulation layer 3510 having a relatively excellent step coverage may cover at least a portion of the inner surface of the third opening OP3 of the third sub-pixel area PA3. In addition, the third sub-pixel inorganic encapsulation layer 3510 may be continuously formed to cover the upper surface of the third dummy opposite electrode 3230*b*.

Figure 7M:
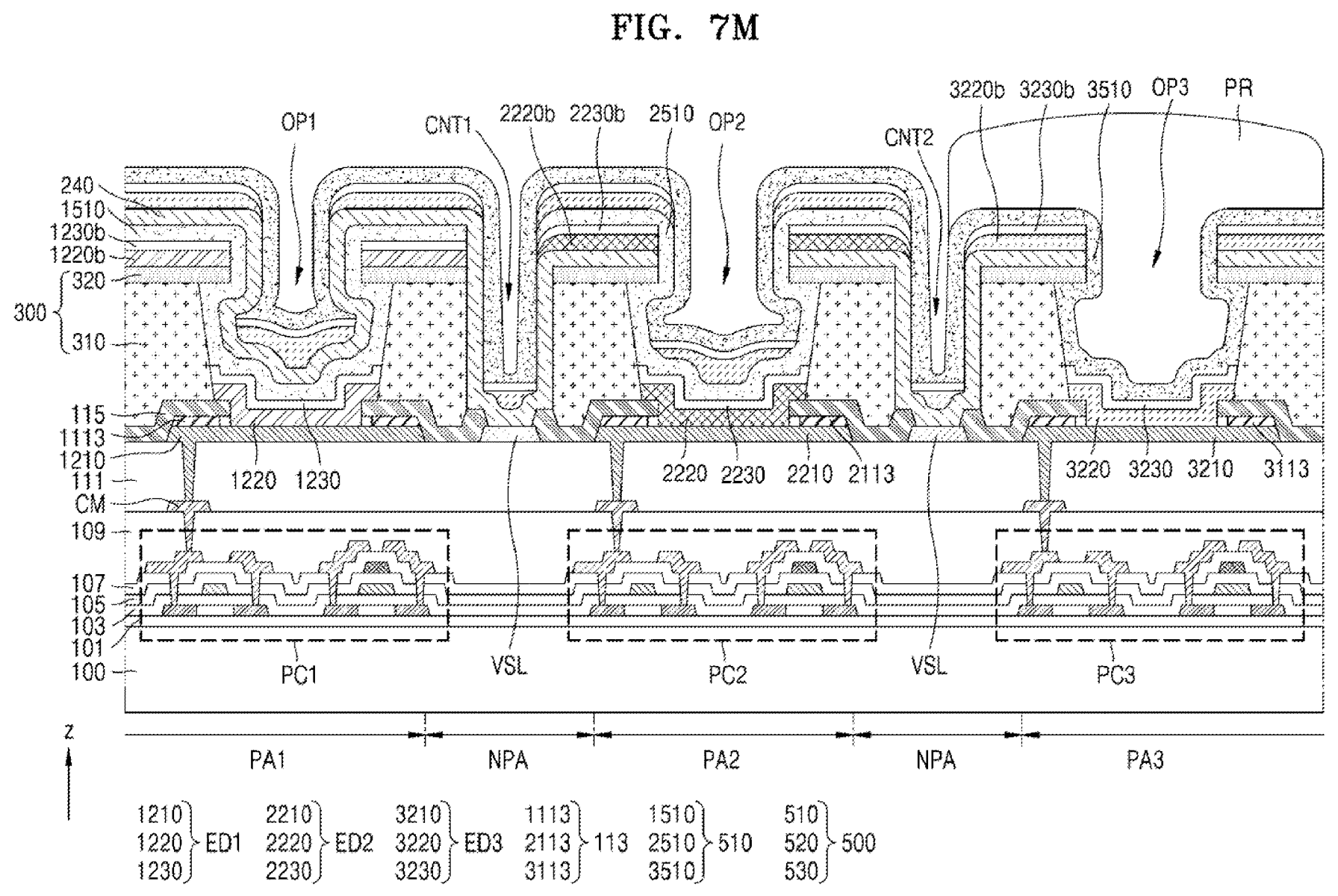

Next, referring to FIG. 7M, the photoresist PR may be formed on the third sub-pixel inorganic encapsulation layer 3510. However, the photoresist PR may be formed in only the third sub-pixel area PA3 to overlap the third sub-pixel electrode 3210. Because the photoresist PR is formed to overlap the third sub-pixel area PA3, the photoresist PR may be formed to fill the third opening OP3 formed in the third sub-pixel area PA3. The photoresist PR may be formed by forming a photosensitive material layer on the third sub-pixel inorganic encapsulation layer 3510 and then exposing and developing the photosensitive material layer using a full-tone mask.

Figure 7N:
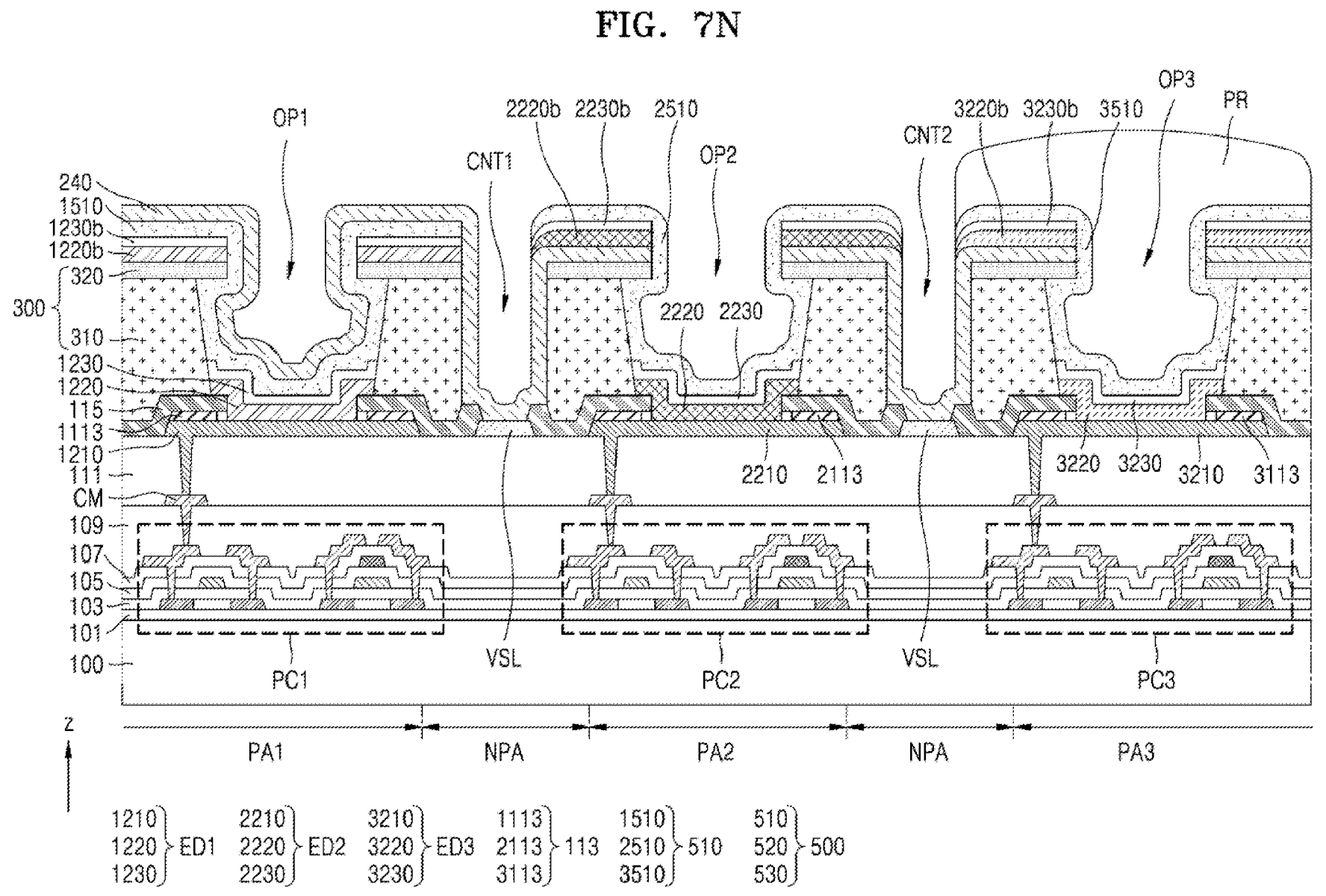

Next, referring to FIG. 7N, a portion of the structure located in a region except for the third sub-pixel area PA3 may be removed using the photoresist PR as a mask. For example, a portion of the third dummy intermediate layer 3220*b*, a portion of the third dummy opposite electrode 3230*b*, and a portion of the third sub-pixel inorganic encapsulation layer 3510 each arranged in the first sub-pixel area PA1, the second sub-pixel area PA2, and the non-sub-pixel area NPA except for the third sub-pixel area PA3, may be removed. In addition, the third intermediate layer 3220, the third dummy intermediate layer 3220*b*, the third opposite electrode 3230, the third dummy opposite electrode 3230*b*, and the third sub-pixel inorganic encapsulation layer 3510 may be arranged in only the third sub-pixel area PA3.

Next, referring to FIG. 7O, the organic encapsulation layer 520 and the second inorganic encapsulation layer 530 may be formed on the connection electrode 240, the second sub-pixel inorganic encapsulation layer 2510, and the second sub-pixel inorganic encapsulation layer 3510.

The organic encapsulation layer 520 may be formed by coating and curing monomer. According to some embodiments, a portion of the organic encapsulation layer 520 may at least partially fill the first to third openings OP1, OP2, and OP3, the first contact hole CNT1, and/or the second contact hole CNT2.

The second inorganic encapsulation layer 530 may include at least one inorganic material from among aluminum oxide, titanium oxide, tantalum oxide, hafnium oxide, zinc oxide, silicon oxide, silicon nitride, and silicon oxynitride and be deposited using chemical vapor deposition.

In the display apparatus according to some embodiments, because the intermediate layer and the opposite electrode of the light-emitting diode may be formed without using the mask, damage to the elements included in the display apparatus may be prevented or reduced and the resolution may be relatively increased. In addition, a voltage drop of the opposite electrode may be prevented or reduced using the electrical connection of the opposite electrode, the metal bank layer, and the common voltage electrode. However, these characteristics are merely an example, and the scope of embodiments according to the present disclosure is not limited by these characteristics.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims, and their equivalents.

What is claimed is:

1. A display apparatus comprising:

a first sub-pixel electrode;

a common voltage electrode adjacent to the first sub-pixel electrode;

a metal bank layer having a first opening and a first contact hole and including a first metal layer and a second metal layer on the first metal layer, wherein the first opening overlaps the first sub-pixel electrode, and the first contact hole overlaps the common voltage electrode;

an insulating layer between an outer portion of the first sub-pixel electrode and the metal bank layer;

a first intermediate layer overlapping the first sub-pixel electrode at the first opening of the metal bank layer;

a first opposite electrode on the first intermediate layer at the first opening of the metal bank layer and electrically connected to the metal bank layer; and a connection electrode electrically connected to the common voltage electrode through the first contact hole of the metal bank layer, wherein the connection electrode electrically connects the metal bank layer to the common voltage electrode.

2. The display apparatus of claim 1, wherein the first opposite electrode directly contacts a lateral surface of the first metal layer facing the first opening of the metal bank layer.

3. The display apparatus of claim 1, wherein the connection electrode directly contacts a lateral surface of the metal bank layer facing the first contact hole of the metal bank layer.

4. The display apparatus of claim 3, further comprising a first inorganic encapsulation layer on the first opposite electrode, wherein the connection electrode extends on the first inorganic encapsulation layer.

5. The display apparatus of claim 4, further comprising:

a first organic encapsulation layer on the connection electrode; and a second inorganic encapsulation layer on the first organic encapsulation layer.

6. The display apparatus of claim 1, wherein a portion of the second metal layer facing the first opening of the metal bank layer includes a tip extending to the first opening from a point at which a bottom surface of the second metal layer contacts a lateral surface of the first metal layer.

7. The display apparatus of claim 1, wherein the connection electrode includes a same material as a material of the first opposite electrode.

8. The display apparatus of claim 1, further comprising a protective layer between the outer portion of the first sub-pixel electrode and the insulating layer.

9. The display apparatus of claim 8, wherein the protective layer includes a transparent conductive oxide (TCO).

10. The display apparatus of claim 1, further comprising a first dummy intermediate layer including a same material as a material of the first intermediate layer and on the second metal layer.

11. The display apparatus of claim 10, further comprising a first dummy opposite electrode including a same material as a material of the first opposite electrode and on the first dummy intermediate layer.

12. The display apparatus of claim 1, further comprising:
a second sub-pixel electrode;
a second intermediate layer overlapping the second sub-pixel electrode at a second opening of the metal bank layer; and
a second opposite electrode on the second intermediate layer at the second opening of the metal bank layer,
wherein the common voltage electrode is between the first sub-pixel electrode and the second sub-pixel electrode.

13. The display apparatus of claim 12, further comprising:
a second dummy intermediate layer including a same material as a material of the second intermediate layer and on the second metal layer; and
a second dummy opposite electrode including a same material as a material of the second opposite electrode and on the second dummy intermediate layer,
wherein the connection electrode is between the second dummy intermediate layer and the second metal layer.

14. A method of manufacturing a display apparatus, the method comprising:
forming a sub-pixel electrode including a first sub-pixel electrode, a second sub-pixel electrode, and a third sub-pixel electrode;
forming a common voltage electrode adjacent to at least one of the first sub-pixel electrode, the second sub-pixel electrode, or the third sub-pixel electrode;
forming an insulating layer on the first sub-pixel electrode, the second sub-pixel electrode, the third sub-pixel electrode, and the common voltage electrode;
forming a metal bank layer on the insulating layer, the metal bank layer including a first metal layer and a second metal layer on the first metal layer;
forming a first opening of the metal bank layer overlapping the first sub-pixel electrode;
forming an opening of the insulating layer overlapping the first sub-pixel electrode;
forming a first intermediate layer overlapping the first sub-pixel electrode at the first opening of the metal bank layer and the opening of the insulating layer;
forming a first opposite electrode on the first intermediate layer at the first opening of the metal bank layer and the opening of the insulating layer;
forming a first contact hole in the insulating layer and the metal bank layer to overlap the common voltage electrode; and
forming a connection electrode electrically connected to the common voltage electrode through the first contact hole and electrically connecting the metal bank layer to the common voltage electrode.

15. The method of claim 14, wherein the forming of the first opposite electrode comprises depositing the first opposite electrode such that the first opposite electrode directly contacts a lateral surface of the first metal layer facing the first opening of the metal bank layer, and
the forming of the connection electrode comprises depositing the connection electrode such that the connection electrode directly contacts a lateral surface of the first metal layer facing the first contact hole of the metal bank layer.

16. The method of claim 14, wherein the forming of the first contact hole comprises forming photoresists to respectively overlap the first sub-pixel electrode, the second sub-pixel electrode, and the third sub-pixel electrode.

17. The method of claim 16, wherein the forming of the photoresist comprises:
forming a first photoresist to overlap the first sub-pixel electrode using a full-tone mask;
forming a second photoresist to overlap the second sub-pixel electrode using a half-tone mask; and
forming a third photoresist to overlap the third sub-pixel electrode using a half-tone mask.

18. The method of claim 17, wherein the forming of the first contact hole comprises:
removing a portion of the insulating layer, the metal bank layer, the first intermediate layer, and the first opposite electrode overlapping the common voltage electrode; and
removing a portion of the first intermediate layer and the first opposite electrode overlapping the second photoresist and the third photoresist.

19. The method of claim 14, further comprising forming a first inorganic encapsulation layer on the first opposite electrode,
wherein the connection electrode is formed on the first inorganic encapsulation layer.

20. The method of claim 14, wherein the forming of the first opening of the metal bank layer comprises etching the first metal layer such that a portion of the second metal layer facing the first opening of the metal bank layer includes a tip extending to the first opening from a point at which a bottom surface of the second metal layer contacts a lateral surface of the first metal layer.

* * * * *